United States Patent
Ishimori et al.

(10) Patent No.: US 8,686,708 B2
(45) Date of Patent: Apr. 1, 2014

(54) SWITCHING CIRCUIT

(75) Inventors: Toshifumi Ishimori, Kanagawa-ken (JP); Mitsuru Sugawara, Kanagawa-ken (JP); Toshiki Seshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 429 days.

(21) Appl. No.: 12/725,021

(22) Filed: Mar. 16, 2010

(65) Prior Publication Data

US 2010/0237842 A1 Sep. 23, 2010

(30) Foreign Application Priority Data

Mar. 19, 2009 (JP) .................................. 2009-068828
Sep. 9, 2009 (JP) .................................. 2009-208286

(51) Int. Cl.
G05F 1/445 (2006.01)
H02M 3/18 (2006.01)
H02M 7/00 (2006.01)

(52) U.S. Cl.
USPC ........................................... 323/350; 363/60

(58) Field of Classification Search
USPC ................ 323/268, 284, 323, 325, 350, 351; 363/21.12–21.18, 60; 700/292–296
See application file for complete search history.

(56) References Cited

U.S. PATENT DOCUMENTS

| | | | | | |
|---|---|---|---|---|---|
| 4,521,726 | A | * | 6/1985 | Budnik | 323/283 |
| 4,713,742 | A | * | 12/1987 | Parsley | 363/124 |
| 6,020,781 | A | * | 2/2000 | Fujioka | 327/541 |
| 7,474,086 | B2 | * | 1/2009 | Chen et al. | 323/288 |
| 2004/0120169 | A1 | * | 6/2004 | Schrom et al. | 363/65 |
| 2006/0028850 | A1 | * | 2/2006 | Brooks et al. | 363/65 |
| 2006/0239046 | A1 | * | 10/2006 | Zane et al. | 363/65 |
| 2006/0261880 | A1 | * | 11/2006 | Hidaka et al. | 327/536 |

FOREIGN PATENT DOCUMENTS

JP 2008035560 2/2008
JP 2008124805 5/2008

OTHER PUBLICATIONS

Japanese Office Action for Japanese Application No. 2009-208286 mailed on Jan. 11, 2013.

* cited by examiner

Primary Examiner — Jue Zhang
(74) Attorney, Agent, or Firm — White & Case LLP

(57) ABSTRACT

A switching circuit includes: a switching section including at least one first terminal, a plurality of second terminals, and a switching element configured to connect the first terminal to one of the second terminals; a driver driving the switching element in accordance with an external terminal switching control signal; a DC-to-DC converter, which supplies electric power to the driver, having a first state with a response to a load transient and a second state with the response to a load transient being slower than the first state; and a power controller controlling the DC-to-DC converter to operate with the first state during a first time period corresponding to change in the external terminal switching control signal, and to operate with the second state during a second time period other than the first time period.

5 Claims, 19 Drawing Sheets

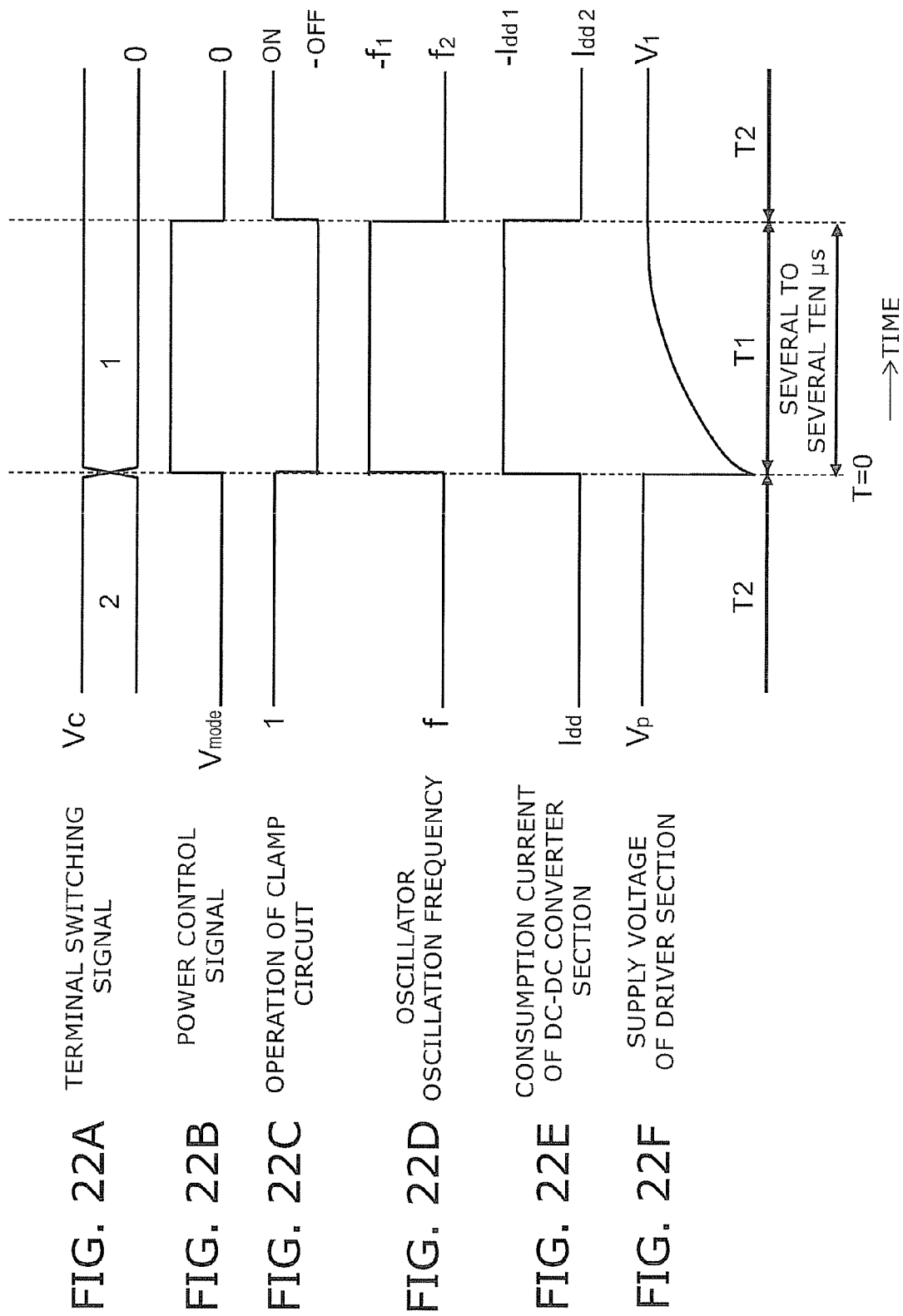

SWITCHING CIRCUIT

CROSS-REFERENCE TO RELATED APPLICATIONS

This application is based upon and claims the benefit of priority from the prior Japanese Patent Application No. 2009-068828, filed on Mar. 19, 2009 and the prior Japanese Patent Application No. 2009-208286, filed on Sep. 9, 2009; the entire contents of which are incorporated herein by reference.

BACKGROUND

1. Field

Embodiments of this invention relate generally to a switching circuit.

2. Background Art

With the extension of functionality, recent mobile communication units require smaller constituent elements and lower current consumption. Furthermore, to achieve multi-band capability, the mobile communication unit includes a plurality of transmitting circuits and receiving circuits, whose connection to the antenna is switched by using an antenna switch. Key characteristics required for the antenna switch include insertion loss and port-port isolation of the switch, as well as distortion characteristics.

For instance, for a switching element implemented by FETs (field effect transistors), its distortion characteristics can be improved by methods such as increasing the operating voltage. To this end, recent switching circuits often include a power supply section such as a DC-to-DC converter circuit to step up the operating voltage inside.

On the other hand, JP-A-2008-124805 (Kokai), for instance, proposes a configuration for lower current consumption in which a semiconductor switching integrated circuit includes a terminal for controlling a DC-to-DC converter circuit so as to enable operation of the DC-to-DC converter circuit only when low distortion is required, such as when transmitting a large signal.

SUMMARY

According to an aspect of the invention, there is provided a switching circuit including: a switching section including at least one first terminal, a plurality of second terminals, and a switching element configured to connect the first terminal to one of the second terminals; a driver driving the switching element in accordance with an external terminal switching control signal; a DC-to-DC converter, which supplies electric power to the driver, having a first state with a response to a load transient and a second state with the response to a load transient being slower than the first state; and a power controller controlling the DC-to-DC converter to operate with the first state during a first time period corresponding to change in the external terminal switching control signal, and to operate with the second state during a second time period other than the first time period.

BRIEF DESCRIPTION OF THE DRAWINGS

FIGS. 22A to 22F are timing charts of major signals in the switching circuit shown in FIG. 21.

DETAILED DESCRIPTION

Figure 1:
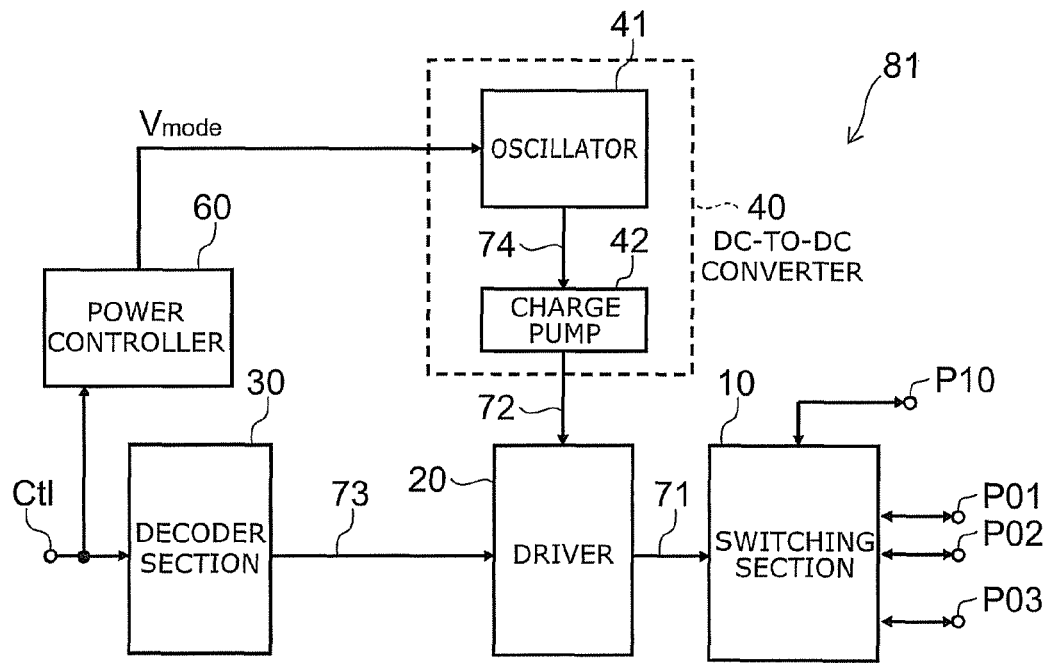
FIG. 1 is a block diagram illustrating the configuration of a switching circuit according to an embodiment of the invention.

Embodiments of the invention will now be described in detail with reference to the drawings.

In the specification and drawings, the same elements as those described previously with reference to earlier figures are labeled with like reference numerals, and the detailed description thereof is omitted as appropriate.

The logic low level is denoted by "0", and the logic high level is denoted by "1". Furthermore, an m-bit signal D (m being a natural number greater than one) is written from left to right in the order from the most significant bit (MSB) to the least significant bit (LSB). For instance, for m=3, the signal D=4 is represented as "100".

First Embodiment

FIG. 1 is a block diagram illustrating the configuration of a switching circuit according to an embodiment of the invention.

As shown in FIG. 1, the switching circuit 81 of this embodiment includes a switching section 10, a driver 20, a decoder section 30, a DC-to-DC converter 40, and a power controller 60. These are formed in the same semiconductor substrate to provide a one-chip structure, or formed in a plurality of chips and packaged in one package.

The switching circuit 81 of this embodiment can illustratively be used in an antenna switch for a cell phone unit including a plurality of receiving sections and a plurality of transmitting sections. A first terminal P10 is connected to the antenna, and a second terminal P01-P0N is connected to each of the plurality of receiving sections and the plurality of transmitting sections, so that the antenna can be shared among the plurality of receiving sections and the plurality of transmitting sections.

First, the overall configuration is described.

The switching section 10 includes a switching element for connecting the first terminal P10 to one of the plurality of second terminals P01-P03. In this embodiment, the first terminal P10 is illustratively connected to one of three second terminals P01, P02, and P03.

The decoder section 30 decodes a external terminal switching control signal inputted through a control terminal Ctl to generate a switching control signal 73 for controlling whether the switching element of the switching section 10 is set in the conducting or non-conducting state.

The driver 20 receives as input the output 73 (switching control signal) of the decoder section 30 and the output 72 (power) of the DC-to-DC converter 40 to generate a switching driving signal 71 for driving the switching element of the switching section 10.

This embodiment illustrates a configuration including the decoder section 30 which decodes a external terminal switching control signal to input a switching control signal 73 to the driver 20. However, the invention is not limited thereto. The external terminal switching control signal inputted to the control terminal Ctl may be directly inputted to the driver 20 to drive the switching element.

In this embodiment, to control the three second terminals P01, P02, and P03, the external terminal switching control signal inputted through the control terminal Ctl has two bits. The switching control signal 73 decoded and the switching driving signal 71 for driving the switching element are outputted through at least three signal lines.

The DC-to-DC converter 40 is a circuit for generating power for driving the switching element of the switching section 10, and is controlled by the output (power control signal) $V_{mode}$ of the power controller 60. Here, the DC-to-DC converter 40 can have a first state with a recovery response to a load transient, and a second state with the recovery response to the load transient being slower than the first state. In the second state, because of its slower recovery response to a load transien, current consumption is lower than in the first state.

In the switching circuit 81 of this embodiment, the DC-to-DC converter 40 illustratively includes an oscillator 41 and a charge pump 42. The charge pump 42 is driven by an output 74 of the oscillator 41. More specifically, in the first state, the oscillator 41 of the DC-to-DC converter 40 drives the charge pump 42 at a first frequency, and in the second state the oscillator 41 drives the charge pump 42 at a second frequency lower than the first frequency.

During a second time period with no change in the inputted external terminal switching control signal, or during the steady state, the power controller 60 controls the DC-to-DC converter 40 so as to set it in the second state. Then, only during a definite time period T1, or a first time period, corresponding to change in the inputted external terminal switching control signal, the DC-to-DC converter 40 is controlled so as to be in the first state. Furthermore, the lapse of the first time period is followed by the second time period in which the DC-to-DC converter 40 is controlled so as to return to the second state.

Although this embodiment illustrates a configuration in which the power controller 60 receives as input the signal from the control terminal Ctl, the change in the inputted external terminal switching control signal can also be detected by receiving as input the signal of the output (switching control signal) 73 of the decoder section 30. However, it is more desirable to receive as input the signal from the control terminal Ctl, which requires detection of a smaller number of signals.

Here, the first time period is a time period from variation in the output of the DC-to-DC converter 40 due to change in the external terminal switching control signal until its return to the equilibrium voltage before the change in the external terminal switching control signal. This first time period is a design value determined from the response of the switching section 10, the driver 20, and the DC-to-DC converter 40 to a load transient.

Thus, the switching circuit 81 of this embodiment is normally in the second time period and controls the DC-to-DC converter 40 so as to set it in the second state, and only during the first time period in response to change in the inputted external terminal switching control signal, the switching circuit 81 controls the DC-to-DC converter 40 so as to set it in the first state. Then, after the lapse of the first time period, the DC-to-DC converter 40 is controlled so as to return to the second state. Here, the second time period is a time period other than the first time period, and is not a definite time period unlike the first time period.

That is, in the switching circuit 81 of this embodiment, in the steady state, the DC-to-DC converter 40 is operated in the second state with a slow recovery response to a load transient, or in the state of low current consumption. Then, only during the first time period, which is a definite time period after the second terminal P01-P03 connected to the first terminal P10 is switched, the DC-to-DC converter 40 is operated in the first state with a fast recovery response, or in the state of high current consumption.

Thus, as described later, this embodiment provides a switching circuit with low distortion characteristics and low current consumption.

Next, the switching section 10, the driver 20, and the DC-to-DC converter 40 are described individually.

Figure 2:
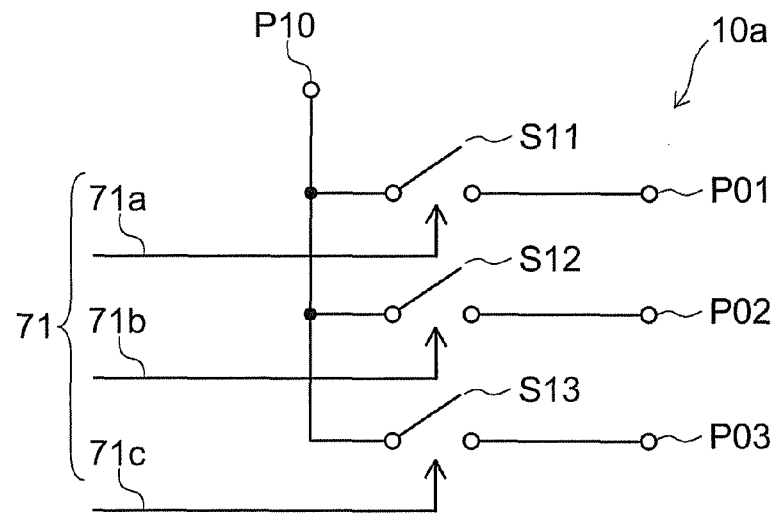
FIG. 2 is a block diagram illustrating the configuration of the switching section shown in FIG. 1.

FIG. 2 is a block diagram illustrating the configuration of the switching section shown in FIG. 1.

As shown in FIG. 2, the switching section 10*a* of this example includes switching elements S11, S12, and S13 for connecting the first terminal P10 to one of the three second terminals P01, P02, and P03. The switching elements S11, S12, and S13 are controllably turned on or off by the switching driving signal of the output 71 of the driver 20.

The switching elements S11, S12, and S13 can illustratively be FETs.

Although this example illustratively includes three second terminals, the invention is not limited thereto. For instance, it is also possible to implement an SPnT (single-pole n-throw) switching including n switching elements. Furthermore, although this example illustratively includes one first terminal, it is also possible to implement an mPnT (m-pole n-throw) switching with an arbitrary number, m, of first terminals each connected to one of n second terminals.

It is noted that this example illustrates the case where the output 71 of the driver 20 is outputted through three signal lines 71*a*, 71*b*, and 71*c*.

Figure 3:
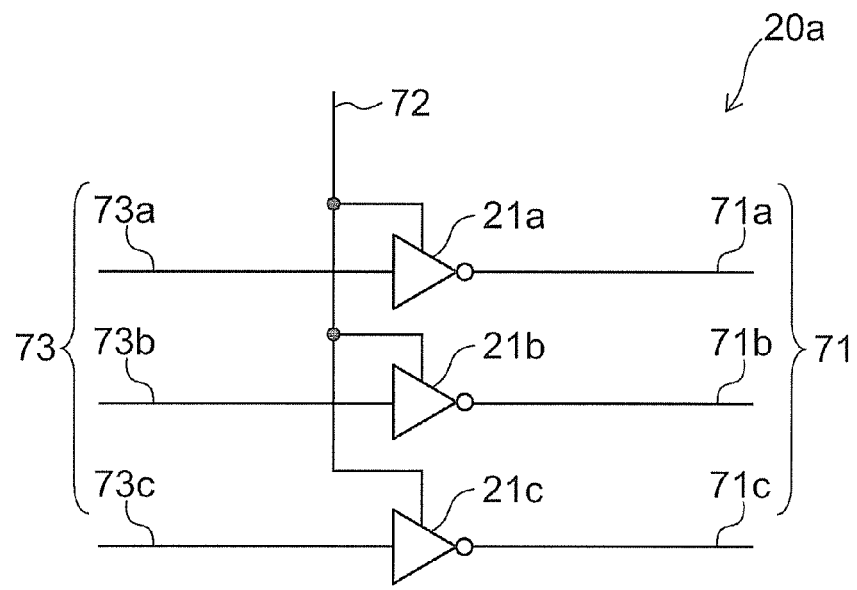
FIG. 3 is a block diagram illustrating the configuration of the driver shown in FIG. 1.

An example of the configuration of the driver 20 for supplying a switching driving signal is illustrated in FIG. 3.

FIG. 3 is a block diagram illustrating the configuration of the driver shown in FIG. 1.

As shown in FIG. 3, the driver 20a includes three inverters (negation circuits) 21a-21c. The signal lines 71a-71c are connected to the respective output terminals of the inverters 21a-21c. All the power supply terminals of the inverters 21a-21c are supplied with the output 72 of the DC-to-DC converter 40. That is, a voltage different from the externally supplied voltage Vdd (described later in FIG. 4), is supplied from the DC-to-DC converter 40 to the inverters 21a-21c.

The output 73 of the decoder section 30 is inputted to the input terminals of the inverters 21a-21c and the switching control signals decoded from the inputted external terminal switching control signal are respectively inputted to the inverters 21a-21c.

The decoder section 30 decodes the inputted external terminal switching control signal to generate a switching control signal. For instance, in this example, it is implemented by a logic circuit for converting a 2-bit external terminal switching control signal to a 3-bits switching control signal. For instance, when the external terminal switching control signal is switched from 2 to 0, the decoded switching control signal changes from "100" to "001". That is, the switching control signal changes from the state with the third bit (MSB) on to the state with the first bit (LSB) on.

In this embodiment, the DC-to-DC converter 40 for supplying power to the driver 20 includes an oscillator 41 and a charge pump 42. For instance, the oscillator 41 is implemented as illustrated in FIG. 4.

Figure 4:
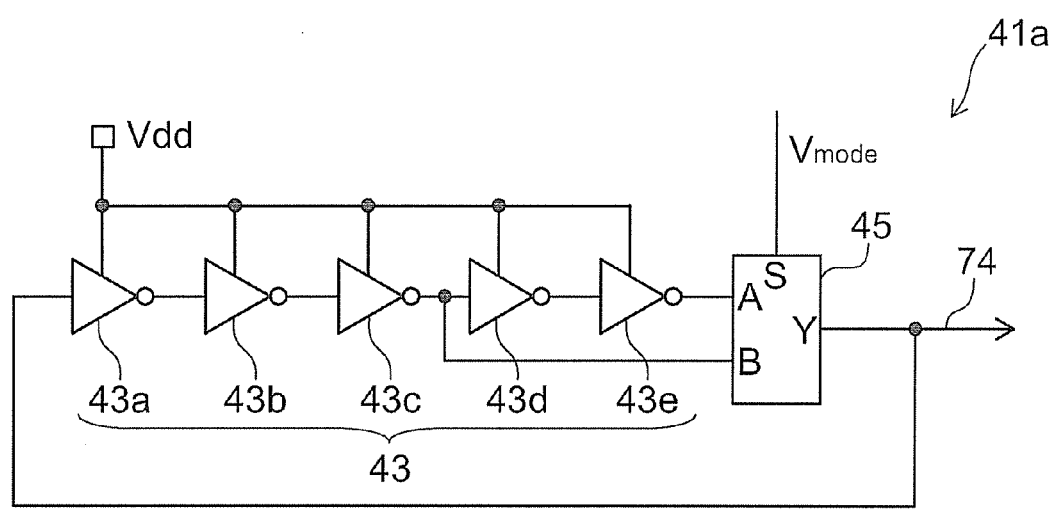
FIG. 4 is a block diagram illustrating the configuration of the oscillator shown in FIG. 1.

As shown in FIG. 4, the oscillator 41a includes a delay circuit 43 and a 2-in/1-out selector circuit 45 (multiplexer). Here, the delay circuit 43 includes an odd number of series connected inverters 43a-43e. Although this example illustrates the case of including five inverters 43a-43e, an arbitrary odd number of inverters can be series connected to implement the delay circuit 43.

The supplied voltage Vdd supplied from outside the switching circuit 81 of this example is supplied to the power supply terminals of the inverters 43a-43e.

The selector circuit 45 (multiplexer) is a logic circuit including two input terminals called an input terminal A and an input terminal B, an output terminal Y, and a select terminal S, whereby the signal inputted to the input terminal A is outputted to the output terminal Y when the signal inputted to the select terminal S is "0", and the signal inputted to the input terminal B is outputted to the output terminal Y when the signal inputted to the select terminal S is "1".

In the oscillator 41a of this example, the output signal of the inverter 43e is inputted to the input terminal A of the selector circuit 45, and the output signal of the inverter 43c is inputted to the input terminal B of the selector circuit 45. The signal of the output terminal Y of the selector circuit 45 is fed back to the input terminal of the inverter 43a, and the output $V_{mode}$ (power control signal) of the power controller 60 is inputted to the select terminal S.

Hence, the oscillator 41a implements a ring oscillator including the inverters 43a-43e when the power control signal $V_{mode}$ outputted from the power controller 60 is "0" (second state), and implements a ring oscillator including the inverters 43a-43c when the signal of the power control signal $V_{mode}$ is "1" (first state).

Thus, the oscillator 41a implements an oscillator 41 having two states which are different in an oscillation frequency depending on the power control signal $V_{mode}$ outputted from the power controller 60. More specifically, the oscillator 41a, in the first state, oscillates at an oscillation frequency $f_1$ of the ring oscillator including the inverters 43a-43c, and in the second state, oscillates at an oscillation frequency $f_2$ of the ring oscillator including the inverters 43a-43e. Here, $f_1 > f_2$, because there are a larger number of stages in the second state.

In this example, the oscillation frequency f is changed by using the selector circuit 45 to switch the number of stages of the inverters 43a-43e constituting the ring oscillator 41a. However, the oscillation frequency f can also be changed by changing the supply voltage Vdd supplied to the inverters 43a-43e. That is, the oscillation frequency f of the voltage-controlled oscillator can also be changed by using the power control signal $V_{mode}$ to change the supply voltage Vdd supplied from outside.

On the other hand, the charge pump 42 driven by the oscillator 41a is illustratively implemented by a capacitor and a switch so that the charge accumulated in the capacitor is transferred for output by the switch. Thus, as the oscillation frequency f of the oscillator 41a becomes lower, the rate of charge transfer becomes slower, and response to a load transient also becomes slower. Hence, the DC-to-DC converter 40 of this example is set in the first state with the first frequency $f_1$ when the power control signal $V_{mode}$ outputted from the power controller 60 is "1", and set in the second state with the second frequency $f_2$, having slower response to a load transient, when the signal of the power control signal $V_{mode}$ is "0", where $f_1 > f_2$.

Thus, the switching circuit 81 of this example is normally in the second time period and controls the DC-to-DC converter 40 so as to set it in the second state, and only during the first time period in response to change in the inputted external terminal switching control signal, the switching circuit 81 controls the DC-to-DC converter 40 so as to set it in the first state. Then, after the lapse of the first time period, the DC-to-DC converter 40 is controlled so as to return to the second state. This embodiment thus provides a switching circuit with low distortion characteristics and low current consumption.

A description is given here of a switching circuit of a comparative example in which the control as described above is not performed.

Comparative Example

Figure 5:
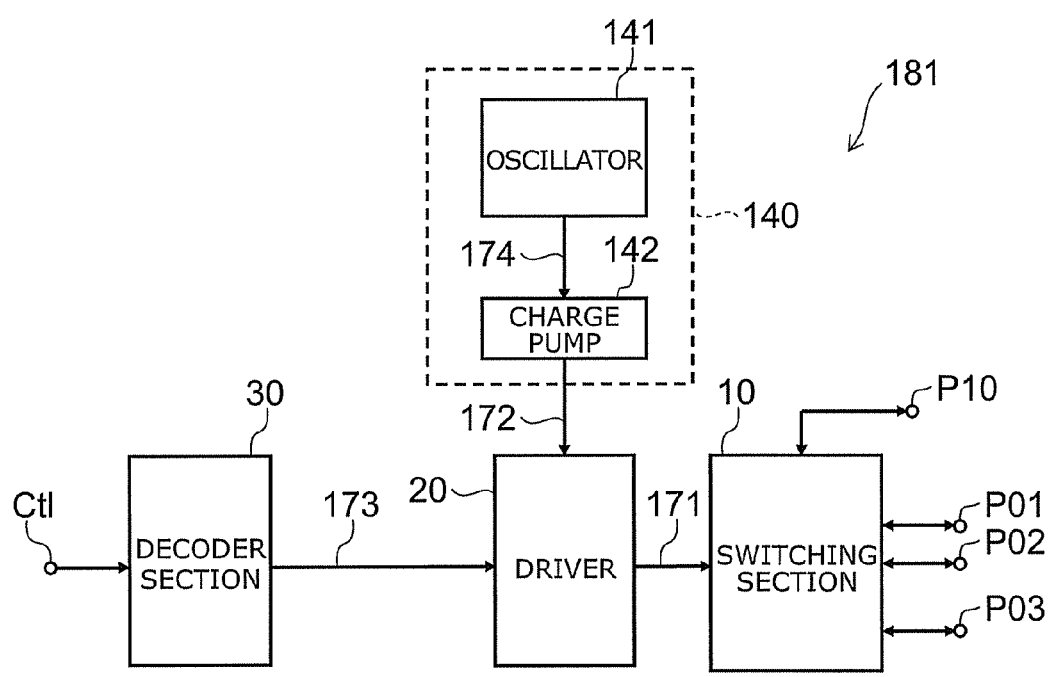
FIG. 5 is a block diagram illustrating the configuration of a switching circuit of a comparative example.

FIG. 5 is a block diagram illustrating the configuration of the switching circuit of the comparative example.

As shown in FIG. 5, the switching circuit 181 of the comparative example includes a switching section 10, a driver 20, a decoder section 30, and a DC-to-DC converter 140.

That is, it is different from the switching circuit 81 of the example in lacking the power controller 60 and including the DC-to-DC converter 140 not controlled by a power control signal.

Thus, in the switching circuit 181 of the comparative example, the DC-to-DC converter 140 includes an oscillator 141 and a charge pump 142, and has a configuration allowing no external control.

An output 171 from the driver 20, an output 172 from the DC-to-DC conversion 140, an output 173 from the decoder section 30 and an output 174 from the oscillator correspond to the switching driving signal 71, the output 72 from the DC-to-DC conversion, the switching control signal 73 and the output 74 from the oscillator 41, respectively.

The operation of the switching circuit 181 of the comparative example is described with reference to timing charts of major signals.

Figure 6:
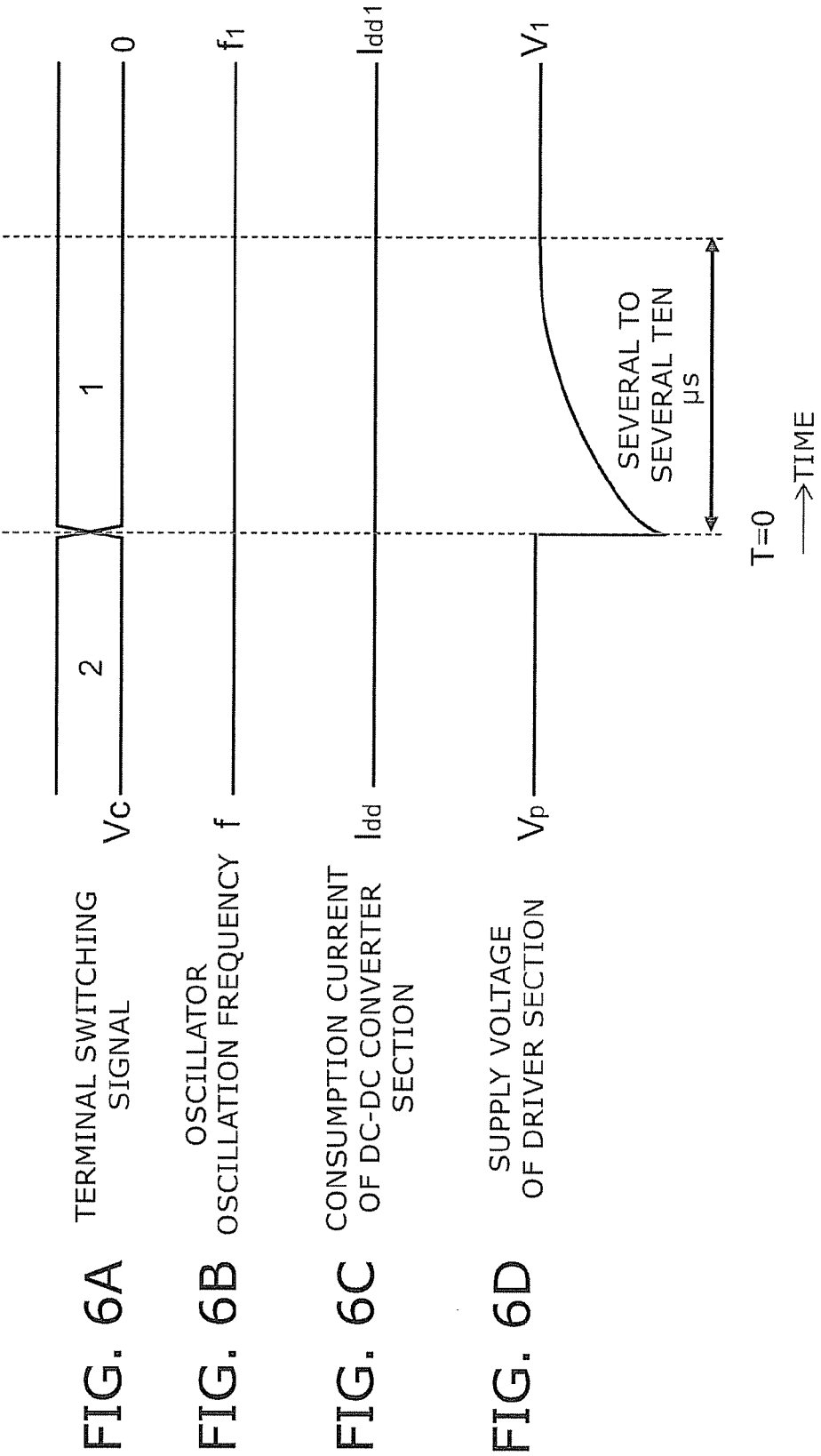
FIGS. 6A to 6D are timing charts of major signals in the switching circuit of the comparative example.

FIGS. 6A to 6D show timing charts of major signals in the switching circuit of the comparative example, where FIG. 6A shows the external terminal switching control signal Vc, FIG. 6B shows the oscillator oscillation frequency f, FIG. 6C shows the consumption current $I_{dd}$ of the DC-to-DC converter, and FIG. 6D shows the supply voltage $V_p$ of the driver.

As shown in FIG. 6A, at time T<0, the external terminal switching control signal is in the state of Vc=2="10". That is, at time T<0, the switching section 10 of the comparative example is in the state in which the first terminal P10 is connected to the second terminal P03.

As shown in FIG. 6B, the oscillation frequency f of the oscillator is constant at $f=f_1$. Furthermore, as shown in FIG. 6D, the supply voltage $V_p$ of the driver 20 supplied from the charge pump 142 is also constant at $V_p=V_1$. Hence, the consumption current $I_{dd}$ of the DC-to-DC converter 140 is constant at $I_{dd}=I_{dd1}$.

Thus, at time T<0, a stable state is realized in which the first terminal P10 is connected to the second terminal P03 in response to the inputted external terminal switching control signal Vc=2.

In this state, consider the case where at time T=0, the connection of the first terminal P10 is switched from the second terminal P03 to, for instance, the second terminal P02. As shown in FIG. 6A, this is the case where the inputted external terminal switching control signal Vc is changed at T=0 from Vc=2 to Vc=1.

The decoder section 30 decodes the external terminal switching control signal Vc and outputs a switching control signal "010" to the driver 20. The driver 20 receives as input the switching control signal "010", generates a switching driving signal, and outputs it to the switching section 10.

At this time, as shown in FIG. 6B, the oscillation frequency f of the oscillator 141 is left unchanged, constant before and after T=0. Furthermore, as shown in FIG. 6C, the consumption current $I_{dd}$ of the DC-to-DC converter is constant at the consumption current $I_{dd1}$.

On the other hand, in the switching section 10, the connection of the first terminal P10 is switched from the second terminal P03 to the second terminal P02. Hence, the switching element so far turned on is turned off, and the switching element so far turned off is turned on. For instance, for a switching element implemented by FETs, when an FET is turned on, electric charge is charged in the gate capacitance of the FET. This temporarily increases release of the charge accumulated in the capacitor of the charge pump 142 and temporarily drops the supply voltage $V_p$ of the driver 20, which subsequently returns to the voltage before switching of the switching section 10 in approximately several to several ten μs until charge is accumulated again in the charge pump 142 (FIG. 6D).

As described above, in operation, the supply voltage $V_p$ of the driver 20 once drops at the time of switching of the second terminal P01-P03 of the switching section 10, and returns to the steady state voltage while the capacitor of the charge pump 142 is recharged. After the voltage drop of $V_p$ at the time of switching of the second terminal P01-P03 of the switching section 10, the time to return to the steady state voltage by charging the capacitor of the charge pump 142 is shorter when the frequency f of the oscillator 141 is higher, and longer when it is lower. Furthermore, the total consumption current of the switching circuit 181 is characterized in that it is larger when the frequency f of the oscillator 141 is higher, and smaller when it is lower.

On the other hand, for instance, mobile units and the like need to meet the requirement that switching of the second terminal P01-P03 of the switching circuit 181 be completed within several to several ten μs to achieve desired RF characteristics. Hence, the frequency f of the oscillator needs to be designed to be the oscillation frequency $f_1$ for satisfying the requirement. However, the switching circuit 181 of the comparative example is driven at the same frequency $f=f_1$ still in the steady state after completion of switching. Hence, the frequency f of the oscillator 141 is set to the frequency corresponding to the time period required for switching of the switch, and the same current constantly flows therein with the current consumption at that time left unchanged. That is, the switching circuit 181 of the comparative example has a higher consumption current.

Next, a description is given of the operation of the switching circuit 81 of the embodiment.

FIGS. 7A to 7E show timing charts of major signals in the switching circuit shown in FIG. 1.

In FIGS. 7A to 7E, timing charts of major signals in the switching circuit 81 are shown, where FIG. 7A shows the external terminal switching control signal Vc, FIG. 7B shows the power control signal $V_{mode}$, FIG. 7C shows the oscillator oscillation frequency f, FIG. 7D shows the consumption current $I_{dd}$ of the DC-to-DC converter 40, and FIG. 7E shows the supply voltage $V_p$ of the driver 20.

As shown in FIG. 7A, at time T<0, the external terminal switching control signal is in the state of Vc=2="10". That is, at time T<0, the switching section 10 is in the state in which the first terminal P10 is connected to the second terminal P03.

Furthermore, as shown in FIG. 7B, at time T<0, because the external terminal switching control signal Vc is left unchanged, the power control signal $V_{mode}$ is "0".

As shown in FIGS. 7C to 7E, at time T<0, the oscillation frequency f of the oscillator 41 is $f=f_2$, and the supply voltage $V_p$ of the driver 20 supplied from the charge pump 42 is also constant at $V_p=V_1$. Furthermore, the consumption current $I_{dd}$ of the DC-to-DC converter 40 is also constant at $I_{dd}=I_{dd2}$.

Thus, at time T<0, a stable state is realized in which the first terminal P10 is connected to the second terminal P03 in response to the inputted external terminal switching control signal Vc=2. Furthermore, the oscillator 41 is oscillated at a low frequency, the second frequency $f_2$, and the DC-to-DC converter 40 is in the second state. That is, the switching circuit 81 is in the state of low current consumption.

In this state, consider the case where at time T=0, the connection of the first terminal P10 is switched from the second terminal P03 to, for instance, the second terminal P02. As shown in FIG. 7A, this is the case where the inputted external terminal switching control signal Vc is changed at T=0 from Vc=2="10" to Vc=1="01".

The decoder section 30 decodes the external terminal switching control signal Vc and outputs a switching control signal 73 to the driver 20. The driver 20 receives as input the switching control signal 73, generates a switching driving signal 71, and outputs it to the switching section 10.

At this time, as shown in FIGS. 7B to 7D, the power control signal $V_{mode}$ changes from "0" to "1", and the oscillation frequency f of the oscillator 41 changes from $f=f_2$ to $f_1$. Furthermore, the consumption current $I_{dd}$ of the DC-to-DC converter 40 also changes to $I_{dd}=I_{dd1}$. In sum, the resulting state is the first state of fast response to a load transient, or the state of high current consumption.

As shown in FIG. 7E, the supply voltage $V_p$ of the driver 20 drops because the switching element of the switching section 10 is switched at time T=0.

At this time, as shown in FIGS. 7B to 7D, the power control signal $V_{mode}$ is "1", and hence the oscillation frequency f of the oscillator 41 is the high frequency $f_1$.

That is, while the power control signal $V_{mode}$ is "1", the DC-to-DC converter 40 is in the first state of fast response to a load transient. The oscillation frequency f of the oscillator 41 in this first state is $f_1$, which is equal to that of the switching circuit 181 of the comparative example.

Hence, as shown in FIG. 7E, as in the switching circuit 181 of the comparative example, the supply voltage $V_p$ of the driver 20 returns to the steady state voltage in several to several ten µs.

This time period for the supply voltage $V_p$ of the driver 20 to return to the steady state serves as the first time period T1. The power controller 60 performs control so that the power control signal $V_{mode}$ returns from "1" to "0" after the lapse of the first time period T1 (FIG. 7B).

When the power control signal $V_{mode}$ becomes "0", the oscillation frequency f of the oscillator 41 returns to $f_2$. The consumption current $I_{dd}$ of the DC-to-DC converter 40 also returns to $I_{dd2}$, which is lower than $I_{dd1}$.

Subsequently, the time T>T1 is again in the second time period T2 with the state of low current consumption. At this time, the capacitor of the charge pump 42, which released charge to switch the switching element, has already been recharged, and hence has no problem with its operation even in the second state in which the oscillator 41 is operated at low frequency.

Thus, provided that the switching circuit 181 of the comparative example shown in FIG. 5 includes the same charge pump, decoder section, and switching section as the switching circuit 81 of this embodiment shown in FIG. 1, the oscillation frequency f in the first state, or the first frequency $f_1$, of the switching circuit 81 of this embodiment shown in FIG. 1 can be set equal to the oscillation frequency $f_1$ of the oscillator 141 of the comparative example.

Hence, in contrast to the switching circuit 181 of the comparative example shown in FIG. 5 lacking the power controller 60, the switching circuit 81 of this embodiment shown in FIG. 1 can achieve a lower current consumption in the steady state other than during the terminal switching operation.

For instance, in the case where the switching circuit 81 of this embodiment is used in a UMTS/GSM dual mode cell phone unit, in the UMTS mode, switching of the second terminal connected to the first terminal is performed only at the time of handover during both standby and call in progress. In the GSM mode, during call in progress, terminal switching is performed constantly because it occurs between transmission and reception, and during standby, terminal switching is performed only at the time of handover.

Thus, the switching circuit 81 of this embodiment is set in the first state of high current consumption only when the second terminal P01-P03 connected to the first terminal P10 is switched in response to change in the inputted external terminal switching control signal. Furthermore, it returns to the second state of low current consumption during the second time period in which the steady state recovers after the terminal switching. Thus, this embodiment can achieve low current consumption.

Furthermore, in the second state, or the steady state, the supply voltage $V_p$ of the driver 20 is equal to the supply voltage $V_p=V_1$ of the switching circuit 181 of the comparative example. Thus, low distortion characteristics are also maintained.

Hence, in the case where the switching circuit 81 of this embodiment is used in a cell phone unit, for instance, the second state of low current consumption is the steady state, which leads to reduction of total current consumption in the cell phone unit.

In the switching circuit 81 of this embodiment, the power controller 60 included in the switching circuit 81 detects an external terminal switching control signal to control switching of the operation mode from the second state to the first state. Thus, the switching circuit 81 does not need to include a terminal for externally controlling the DC-to-DC converter 40. This also eliminates the need of control, for instance, for synchronizing the timing between the external terminal switching control signal of the switching circuit 81 and the power control signal $V_{mode}$ for controlling the DC-to-DC converter 40.

In this embodiment, the supply voltage of the driver supplied from the DC-to-DC converter 40 is illustratively higher than the externally supplied voltage Vdd. That is, the DC-to-DC converter 40 is illustratively a step-up power supply. However, the invention is not limited thereto, but can achieve a similar effect also for conversion to any of step-up, step-down, and negative voltage, or combinations thereof.

In the switching circuit 81 of this embodiment, the operation is described with reference to an illustrative configuration of SP3T in which one first terminal P10 is connected to one of three second terminals P01-P03. However, the invention is not limited thereto, but it is also possible to similarly implement an SPnT switching circuit including n (n being a natural number greater than one) second terminals P01-P0N.

Furthermore, it is also possible to similarly implement an mPnT (m-pole n-throw) switching circuit including an arbitrary number, m, of first terminals.

Figure 8:
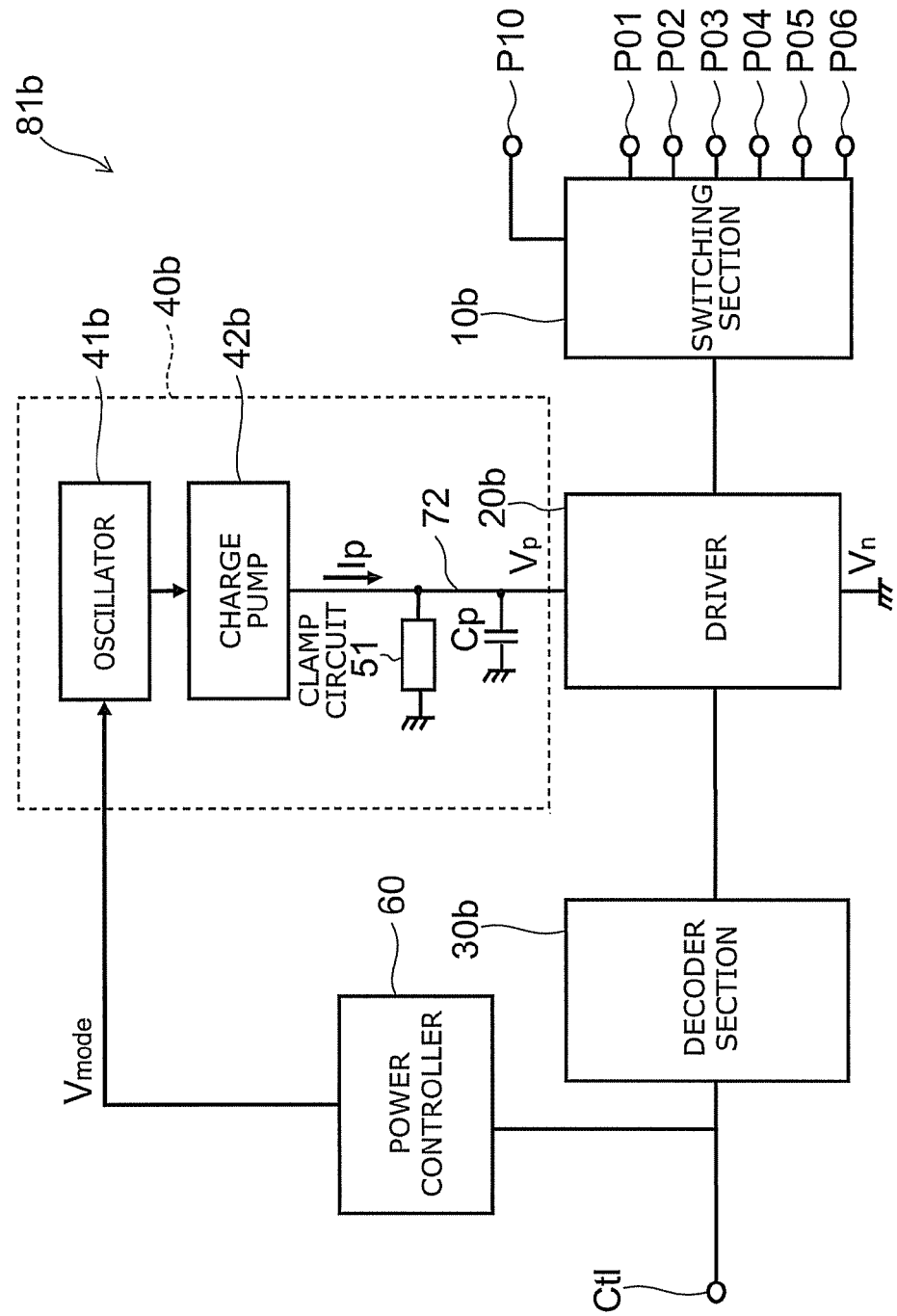
FIG. 8 is a block diagram illustrating another configuration of the switching circuit according to the embodiment of the invention.

FIG. 8 is a block diagram illustrating another configuration of the switching circuit according to the embodiment of the invention.

As shown in FIG. 8, the switching circuit 81b includes a switching section 10b, a driver 20b, a decoder section 30b, a DC-to-DC converter 40b, and a power controller 60. These are formed in the same semiconductor substrate to provide a one-chip structure, or formed in a plurality of chips and packaged in one package.

That is, the switching circuit 81b is implemented by replacing the switching section 10, the driver 20, the decoder section 30, and the DC-to-DC converter 40 of the switching circuit 81 shown in FIG. 1 by the switching section 10b, the driver 20b, the decoder section 30b, and the DC-to-DC converter 40b, respectively. The DC-to-DC converter 40b further includes a capacitor Cp for accumulating the output current and a clamp circuit 51 for preventing the voltage inputted to the driver 20b from exceeding a prescribed range.

Like the switching circuit 81 shown in FIG. 1, the switching circuit 81b can illustratively be used in an antenna switch for a cell phone unit including a plurality of receiving sections and a plurality of transmit sections. A first terminal P10 is connected to the antenna, and a second terminal P01-P06 is connected to each of the plurality of receiving sections and the plurality of transmitting sections, so that the antenna can be shared among the plurality of receiving sections and the plurality of transmitting sections.

As in the switching circuit 81, the switching section 10b of the switching circuit 81b is illustratively implemented like the switching section 10a shown in FIG. 2. Furthermore, for instance, FETs can be used for the switching elements S11-S13 and the like for implementation as shown in FIG. 9.

Figure 9:
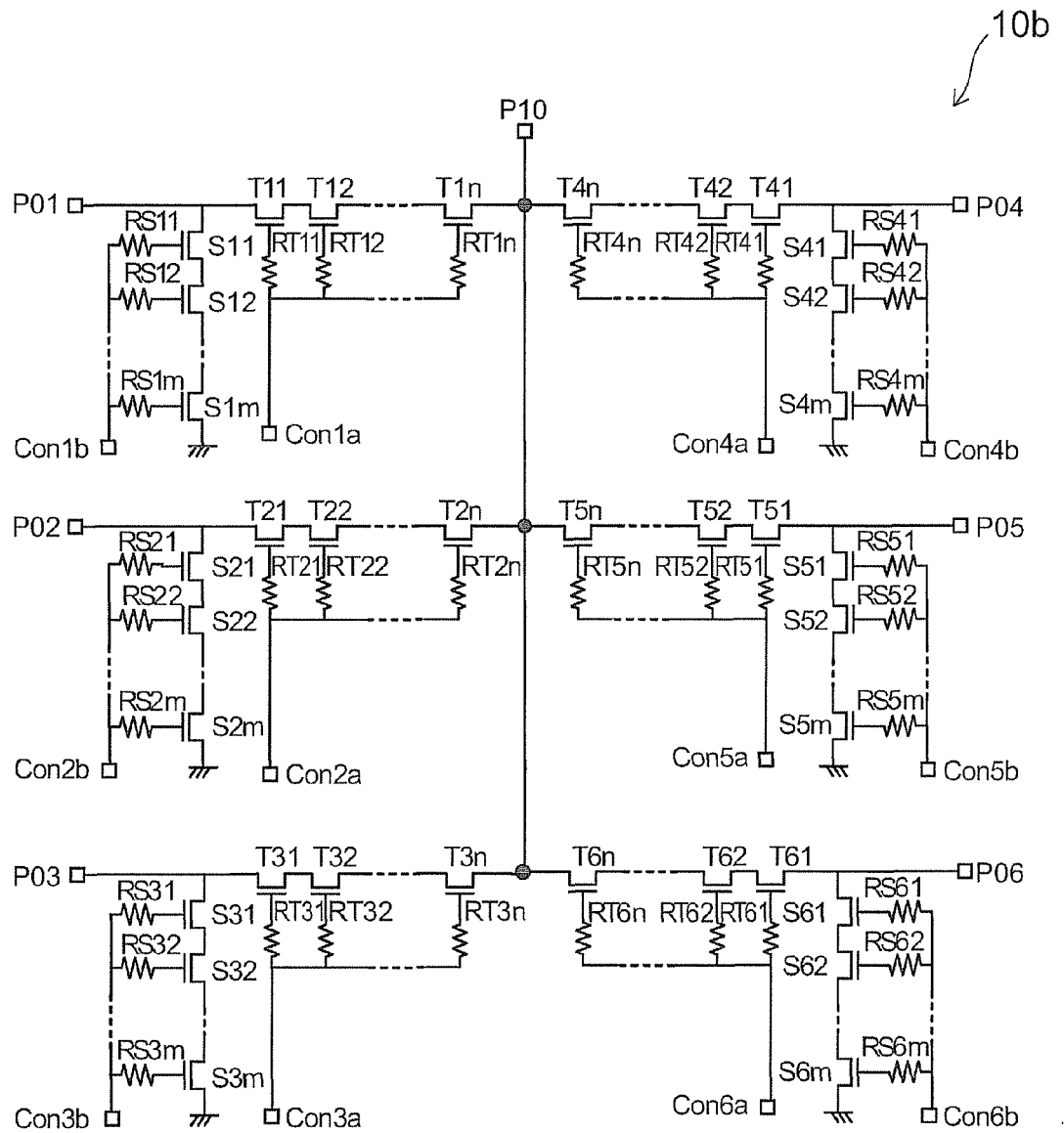
FIG. 9 is a circuit diagram illustrating the configuration of the switching section.

FIG. 9 is a circuit diagram illustrating the configuration of the switching section.

As shown in FIG. 9, n stages (n being a natural number) of through FETs (field effect transistors) T11, T12, ..., T1n, T21, T22, ..., T2n, ..., T61, T62, ..., T6n are connected in series between the first terminal P10 and each of a plurality of second terminals P01-P06.

The through FETs T11, T12, ..., T1n are connected between the first terminal P10 and the second terminal P01. The through FETs T21, T22, ..., T2n are connected between the first terminal P10 and the second terminal P02. The through FETs T31, T32, ..., T3n are connected between the first terminal P10 and the second terminal P03. The through FETs T41, T42, ..., T4n are connected between the first terminal P10 and the second terminal P04. The through FETs T51, T52, ..., T5n are connected between the first terminal P10 and the second terminal P05. The through FETs T61, T62, ..., T6n are connected between the first terminal P10 and the second terminal P06.

Between each of the second terminals P0'-P06 and the ground, m stages (m being a natural number) of shunt FETs S11, S12, ..., S1m, S21, S22, ..., S2m, ..., S61, S62, ..., S6m are connected in series. The shunt FETs S11, S12, ..., S1m are connected between the second terminal P01 and the ground. The shunt FETs S21, S22, ..., S2m are connected between the second terminal P02 and the ground. The shunt FETs S31, S32, ..., S3m are connected between the second terminal P03 and the ground. The shunt FETs S41, S42, ..., S4m are connected between the second terminal P04 and the ground. The shunt FETs S51, S52, ..., S5m are connected between the second terminal P05 and the ground. The shunt FETs S61, S62, ..., S6m are connected between the second terminal P06 and the ground.

The gates of the through FETs T11, T12, ..., T1n connected to the second terminal P01 are connected to a control terminal Con1a respectively through resistors RT11, RT12, ..., RT1n for preventing leakage of radio frequency. The control terminal Con1a is connected to the driver 20b. The resistors RT11, RT12, ..., RT1n each have a resistance high enough to prevent radio-frequency signals from leaking to the driver 20b.

The gates of the shunt FETs S11, S12, ..., S1m connected to the second terminal P01 are connected to a control terminal Con1b respectively through resistors RS11, RS12, ..., RS1m for preventing leakage of radio frequency. The control terminal Con1b is connected to the driver 20b.

The gates of the through FETs T21, T22, ..., T2n connected to the second terminal P02 are connected to a control terminal Con2a respectively through resistors RT21, RT22, ..., RT2n for preventing leakage of radio frequency. The control terminal Con2a is connected to the driver 20b.

The gates of the shunt FETs S21, S22, ..., S2m connected to the second terminal P02 are connected to a control terminal Con2b respectively through resistors RS21, RS22, ..., RS2m for preventing leakage of radio frequency. The control terminal Con2b is connected to the driver 20b.

The gates of the through FETs T31, T32, ..., T3n connected to the second terminal P03 are connected to a control terminal Con3a respectively through resistors RT31, RT32, ..., RT3n for preventing leakage of radio frequency. The control terminal Con3a is connected to the driver 20b.

The gates of the shunt FETs S31, S32, ..., S3m connected to the second terminal P03 are connected to a control terminal Con3b respectively through resistors RS31, RS32, ..., RS3m for preventing leakage of radio frequency. The control terminal Con3b is connected to the driver 20b.

The gates of the through FETs T41, T42, ..., T4n connected to the second terminal P04 are connected to a control terminal Con4a respectively through resistors RT41, RT42, ..., RT4n for preventing leakage of radio frequency. The control terminal Con4a is connected to the driver 20b.

The gates of the shunt FETs S41, S42, ..., S4m connected to the second terminal P04 are connected to a control terminal Con4b respectively through resistors RS41, RS42, ..., RS4m for preventing leakage of radio frequency. The control terminal Con4b is connected to the driver 20b.

The gates of the through FETs T51, T52, ..., T5n connected to the second terminal P05 are connected to a control terminal Con5a respectively through resistors RT51, RT52, ..., RT5n for preventing leakage of radio frequency. The control terminal Con5a is connected to the driver 20b.

The gates of the shunt FETs S51, S52, ..., S5m connected to the second terminal P05 are connected to a control terminal Con5b respectively through resistors RS51, RS52, ..., RS5m for preventing leakage of radio frequency. The control terminal Con5b is connected to the driver 20b.

The gates of the through FETs T61, T62, T6n connected to the second terminal P06 are connected to a control terminal Con6a respectively through resistors RT61, RT62, ..., RT6n for preventing leakage of radio frequency. The control terminal Con6a is connected to the driver 20b.

The gates of the shunt FETs S61, S62, ..., S6m connected to the second terminal P06 are connected to a control terminal Con6b respectively through resistors RS61, RS62, ..., RS6m for preventing leakage of radio frequency. The control terminal Con6b is connected to the driver 20b.

The resistors RT21, ..., RT6n, RS21, ..., RS6m each have a resistance high enough to prevent radio-frequency signals from leaking to the driver 20b.

During turn-off of the through FET connected to the second terminal to which the shunt FET is connected, the shunt FET enhances isolation between that second terminal and the first terminal. More specifically, even when the through FET is turned off, a radio-frequency signal may leak to the second terminal connected to that through FET in the OFF state. At this time, the leaked radio-frequency signal can be dissipated to the ground through the shunt FET in the ON state.

For instance, for conduction between the second terminal P01 and the first terminal P10, the n-stage series connected through FETs T11-T1n between the second terminal P01 and the first terminal P10 are turned on, and the m-stage series connected shunt FETs S11-S1m between the second terminal P01 and the ground are turned off. Simultaneously, the through FETs between the other second terminals P02-P06 and the first terminal P10 are all turned off, and the shunt FETs between each of the other second terminals P02-P06 and the ground are all turned on.

In the above case, the ON potential Von is applied to the control terminal Con1a, the ON potential Von is applied to the control terminals Con2b-Con6b, the OFF potential Voff is applied to the control terminal Con1b, and the OFF potential Voff is applied to the control terminals Con2a-Con6a. The ON potential Von is a gate potential bringing each FET into the conducting state in which its ON resistance has a sufficiently small value. The OFF potential Voff is a gate potential bringing each FET into the blocking state which can be sufficiently maintained even under superposition of a radio-frequency signal. The threshold voltage Vth of each FET is illustratively 0.1 V.

If the ON potential Von is lower than the desired potential (such as 3 V), the ON resistance of the FET in the conducting state increases, degrading insertion loss, and distortion generated by the FET in the conducting state (ON distortion) increases. If the OFF potential Voff is higher than the desired potential (such as −1 V), the maximum allowable input power decreases, and distortion generated by the FET in the blocking state for rated input (OFF distortion) increases.

However, an extremely high ON potential Von or an extremely low OFF potential Voff will exceed the breakdown voltage of the FET. Hence, there is an optimal range for the ON potential Von and the OFF potential Voff.

The control signal for controlling the gate potential of each FET of the switching section 10b is generated by the decoder section 30b and the driver 20b shown in FIG. 8.

Figure 10:
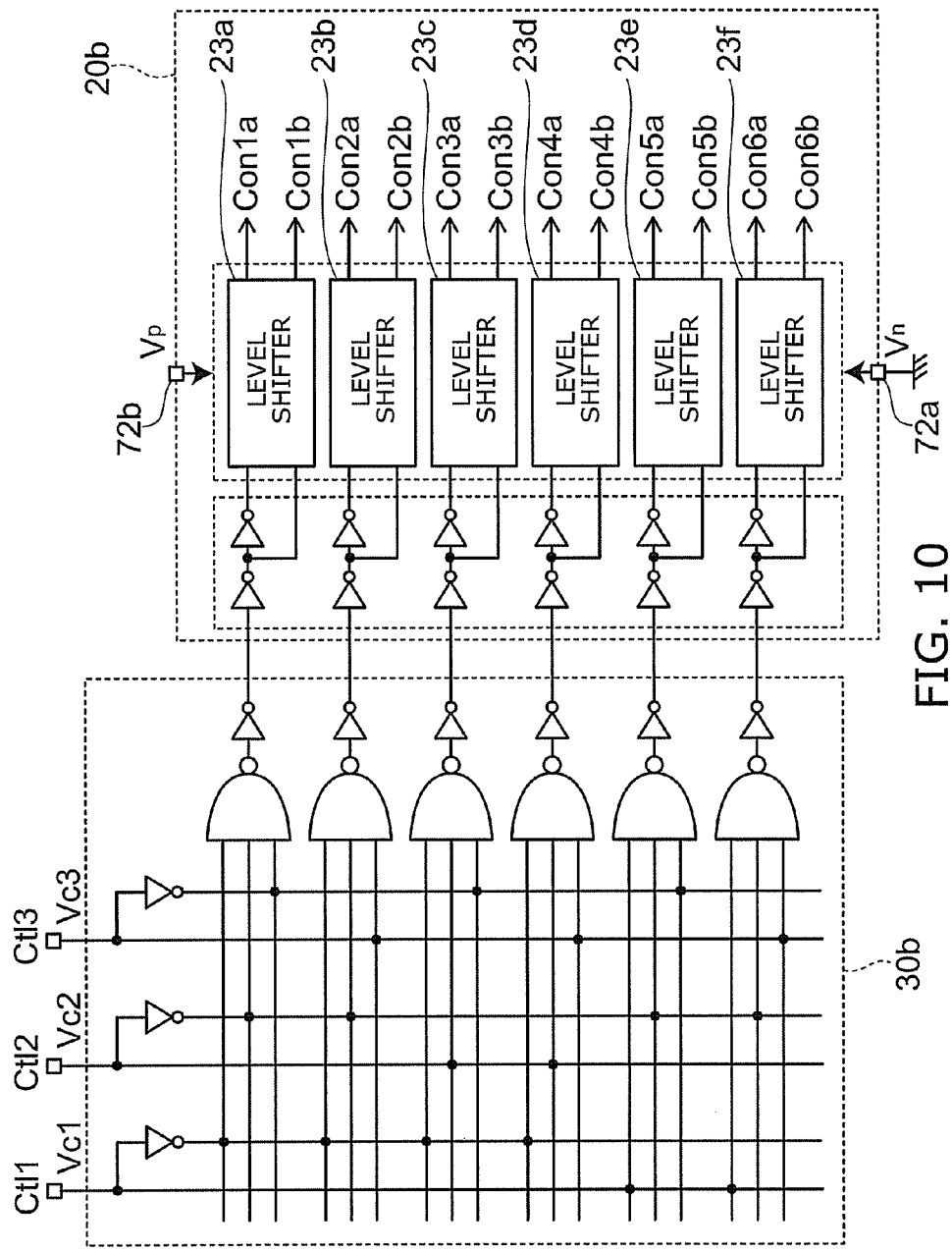
FIG. 10 is a circuit diagram illustrating the configuration of the decoder section and the driver.

FIG. 10 is a circuit diagram illustrating the configuration of the decoder section and the driver.

As shown in FIG. 10, in the driver 20b, level shifters 23a-23f are juxtaposed. Each level shifter 23a-23f is supplied with a voltage $V_p$ which is higher than the supply voltage Vdd supplied to the other circuit sections through a high-potential power supply terminal 72b.

Although the driver 20b may be supplied with a negative voltage $V_n$, the description is given assuming that a low-potential power supply terminal 72a is grounded in FIG. 10.

The switching circuit 81b includes the SP6T switching section 10b. Hence, the decoder section 30b decodes a 3-bit external terminal switching control signal Vc inputted to the control terminal Ctl. Because the level shifters 23a-23f are differential circuits, an inverted/non-inverted signal generating circuit section is provided between the decoder section 30b and the level shifter 23a-23f.

Figure 11:
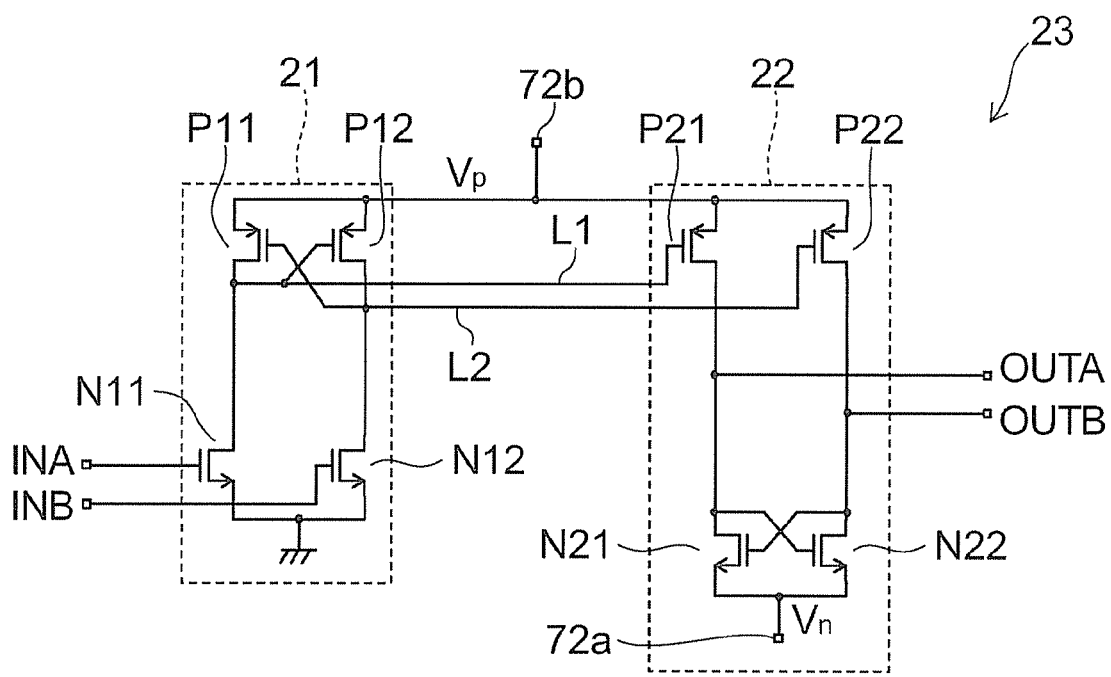
FIG. 11 is a circuit diagram illustrating the configuration of the driver.

FIG. 11 is a circuit diagram illustrating the configuration of the driver.

More specifically, FIG. 11 shows the circuit diagram of the level shifter 23 constituting the driver 20b shown in FIG. 10.

The driver 20b is implemented by six level shifters 23a-23f having the same configuration as the level shifter 23 shown in FIG. 11.

The level shifter 23 includes a first-stage level shifter 21 and a second-stage level shifter 22. The first-stage level shifter 21 includes a pair of N-channel MOSFETs (hereinafter NMOSs) N11, N12 and a pair of P-channel MOSFETs (hereinafter PMOSs) P11, P12. The second-stage level shifter 22 includes a pair of PMOSs P21, P22 and a pair of NMOSs N21, N22.

Each source of the NMOSs N11 and N12 is connected to the ground. The gates of the NMOSs N11 and N12 are connected to the decoder section in the preceding stage, not shown, through input terminals INA and INB, respectively.

The drains of the NMOSs N11 and N12 are connected to the drains of the PMOSs P11 and P12, respectively. Each source of the PMOSs P11 and P12 is supplied with the positive voltage $V_p$ from the DC-to-DC converter 40b (not shown) through the high-potential power supply terminal 72b. The gate of the PMOS P11 is connected to the drain of the PMOS P12, and these are connected to one line L2 of the differential output of the first-stage level shifter 21. The gate of the PMOS P12 is connected to the drain of the PMOS P11, and these are connected to the other line L1 of the differential output of the first-stage level shifter 21.

The above lines L1 and L2 are connected to the gates of the PMOSs P21 and P22 of the second-stage level shifter 22, respectively. The output of the first-stage level shifter 21 is inputted to the second-stage level shifter 22 through the lines L1 and L2. Each source of the PMOSs P21 and P22 is supplied with the positive voltage $V_p$ from the DC-to-DC converter 40b (not shown) through the high-potential power supply terminal 72b.

The drain of the PMOS P21 is connected to the drain of the NMOS N21, and the connection node thereof is connected to an output terminal OUTA. The drain of the PMOS P22 is connected to the drain of the NMOS N22, and the connection node thereof is connected to an output terminal OUTB. The aforementioned ON potential Von and OFF potential Voff are supplied through the output terminals OUTA and OUTB to the gates of the through FETs and shunt FETs of the switching section 10b shown in FIG. 9.

The input level of the differential input INA, INB of the first-stage level shifter 21 is illustratively 1.8 V at high level and 0 V at low level, which are supplied from the decoder section 30b and the inverted/non-inverted signal generating circuit section in the preceding stage, not shown. The high-potential power supply terminal 72b is illustratively supplied with 3.5 V as the positive voltage $V_p$.

For instance, upon input of high level (1.8 V) to INA and low level (0 V) to INB, the line L1 assumes a potential of low level (0 V), and the line L2 assumes a potential of 3.5 V, which is equal to $V_p$. That is, the output amplitude in the first-stage level shifter 21 is approximately 3.5 V, ranging from 0 to $V_p$.

The second-stage level shifter 22 receives as input the output signal of the first-stage level shifter 21. As in the first-stage level shifter 21, the high-potential power supply terminal 72b is illustratively supplied with 3.5 V as the positive voltage $V_p$. The low-potential power supply terminal 72a is illustratively supplied with −1.5 V as the negative voltage $V_n$.

For instance, with the low level (0 V) on the line L1 and the high level (3.5 V) on the line L2, the output terminal OUTA assumes a potential of 3.5 V, which is equal to the positive voltage $V_p$, and the output terminal OUTB assumes a potential of −1.5 V, which is equal to the negative voltage $V_n$. Hence, an ON potential Von of 3.5 V and an OFF potential Voff of −1.5 V can be supplied to the gates of the through FETs and shunt FETs of the switching section 10b shown in FIG. 9, and the switching section 10b is driven.

That is, in the first-stage level shifter 21, a differential input signal with the input high level at Vdd and low level at 0 V is voltage-converted to a differential signal with high level at the positive voltage $V_p$ and low level at 0 V. The output level is converted in the second-stage level shifter 22 to the high level at the positive voltage $V_p$ and low level at the negative voltage $V_n$.

Hence, in the level shifter 23, a differential input signal with the input high level at Vdd and low level at 0 V is voltage-converted to a differential signal with high level at the positive voltage $V_p$ and low level at the negative voltage $V_n$.

In the case where the negative voltage $V_n$ is at the ground potential, the level shifter 23 converts a differential input signal with high level at Vdd and low level at 0 V to a differential output signal with high level at the positive voltage $V_p$ and low level at 0 V. It is noted that in the case where the negative voltage $V_n$ is at the ground potential, the second-stage level shifter 22 may be omitted, and the lines L1 and L2 can serve as the differential output.

Figure 12:
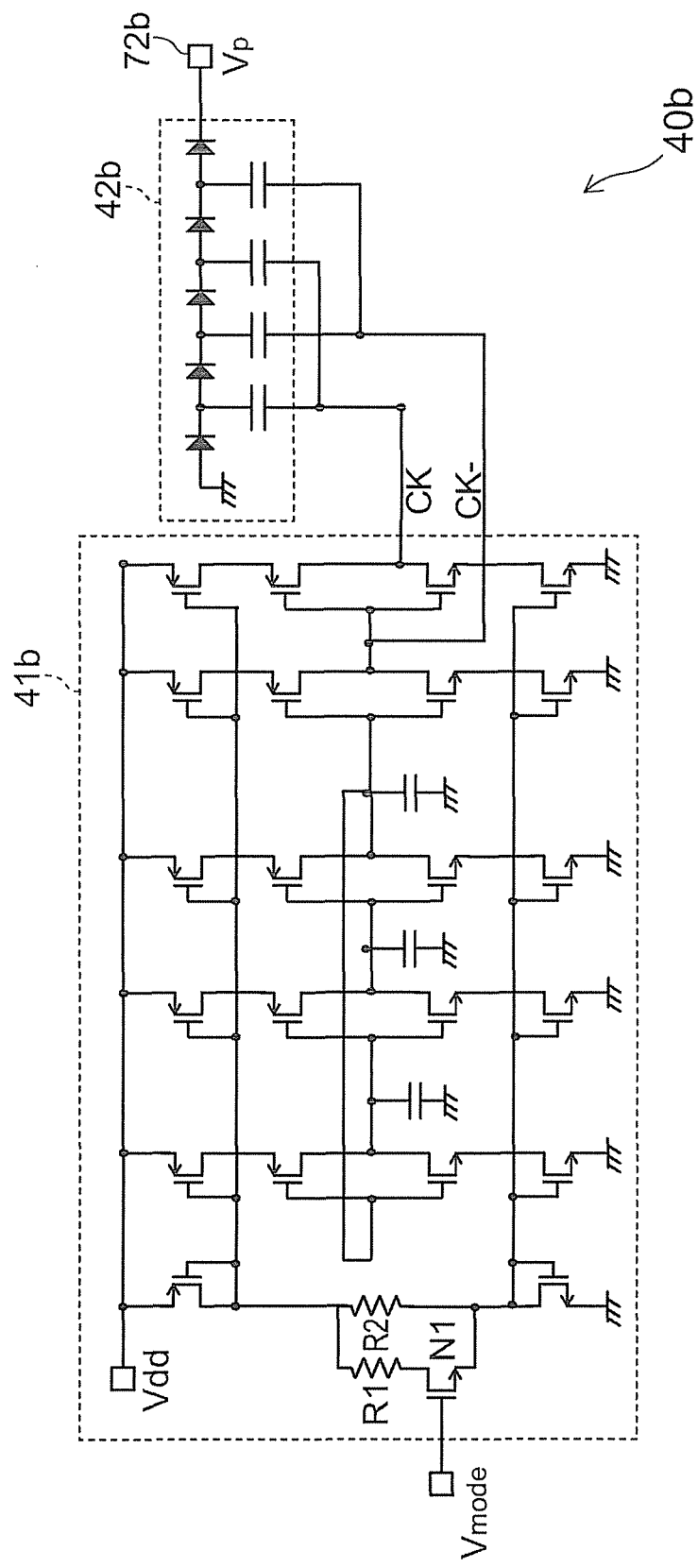
FIG. 12 is a circuit diagram illustrating the configuration of the oscillator and the charge pump.

FIG. 12 is a circuit diagram illustrating the configuration of the oscillator and the charge pump.

As shown in FIG. 12, the charge pump 42b includes a plurality of diodes connected in series between the high-potential power supply terminal 72b and the ground, and a plurality of capacitors connected to between adjacent diodes. Differential clock signals CK, CK−, which is the output of the oscillator 41b are supplied to the plurality of capacitors.

The positive voltage $V_p$ is produced at the high-potential power supply terminal 72b by accumulation and migration of charge in the capacitors in response to the differential clock signals CK, CK−.

The oscillator 41b is implemented by a ring oscillator, buffer, NMOS N1, resistors R1, R2 and the like. The ring oscillator is implemented by three stages of CMOS inverters with current mirror load. To increase delay time, a capacitor is connected between the ground and the junction between the CMOS inverter stages. The output of the ring oscillator is inputted to the buffer of two stages of CMOS inverters with current mirror load, which outputs the differential clock signals CK, CK−.

As the frequency of the differential clock signals CK, CK− increases, the output current of the charge pump 42b also increases. Furthermore, as the current driving capability of the buffer for supplying the differential clock signals CK, CK− increases, the output current of the charge pump 42b also increases.

A resistor R2 is inserted on the reference side of the current mirror. An NMOS N1 and a resistor R1, connected in series, are connected across the resistor R2. The power control signal $V_{mode}$ is inputted to the gate of the NMOS N1.

The resistors R1 and R2 limit the current of the current mirror. Furthermore, the current of the current mirror controls the output current of the ring oscillator 41b. Hence, the resistors R1 and R2 controls the output current of the ring oscillator 41b.

Here, the resistances R1 and R2 of the current mirror are related by R1<R2, and the ON resistance of the NMOS N1 is sufficiently lower than the resistance R1.

When the power control signal $V_{mode}$ is at the low level, the ring oscillator 41b and the DC-to-DC converter 40b are in the second state. The NMOS N1 is turned off, and the output current of the ring oscillator 41b is a current limited by the resistor R2. On the other hand, when the power control signal $V_{mode}$ is at the high level, the ring oscillator 41b and the DC-to-DC converter 40b are in the first state. The NMOS N1 is turned on, and the output current of the ring oscillator 41b is a current limited by the resistors R1 and R2 connected in parallel.

Hence, the output current of the charge pump 42b increases from an output current $I_2$ in the second state to $I_1$ in the first state, which is larger in absolute value than $I_2$.

This reduces the time constant with which the positive voltage $V_p$ attains the desired value.

During the time period in which the power control signal $V_{mode}$ is at the high level, or during the first time period, a current higher than in the steady state occurs in the ring oscillator. However, this time period is very short in the entire operating time, and hence also results in only slight increase in current consumption.

As described with reference to FIG. 1, during a second time period with no change in the inputted external terminal switching control signal Vc, or during the steady state, the power controller 60 controls the DC-to-DC converter 40b so as to set it in the second state. Then, only during a definite time period T1, or a first time period, corresponding to change in the inputted external terminal switching control signal Vc, the DC-to-DC converter 40b is controlled so as to be in the first state. Furthermore, the lapse of the first time period is followed by the second time period in which the DC-to-DC converter 40b is controlled so as to return to the second state.

The power controller 60 can illustratively be implemented by a circuit for detecting both rising and falling edge of the external terminal switching control signal Vc.

Figure 13:
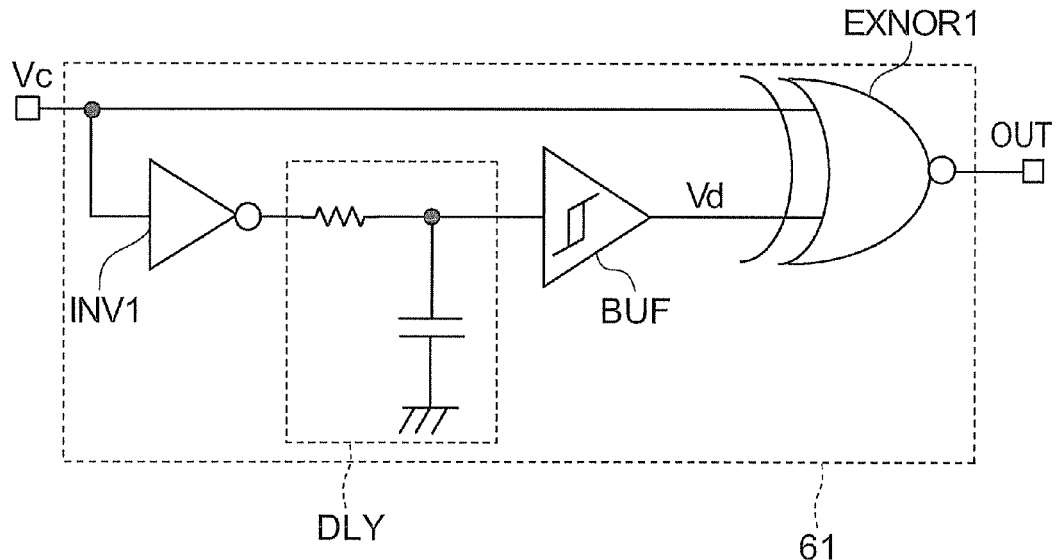
FIG. 13 is a circuit diagram illustrating the configuration of an edge detection circuit.

FIG. 13 is a circuit diagram illustrating the configuration of an edge detection circuit.

As shown in FIG. 13, in the edge detection circuit 61, the negation of the external terminal switching control signal Vc is delayed by an RC delay circuit DLY and waveform-shaped by a buffer BUF to generate a signal Vd. Then, change in the external terminal switching control signal Vc is detected by a circuit EXNOR1 negating the exclusive OR of the external terminal switching control signal Vc and the signal Vd. The output of the circuit EXNOR1 serves as the output OUT of the edge detection circuit 61.

The buffer BUF shown in FIG. 13 is a Schmitt trigger circuit. The signal with the rise and fall slowed by the RC delay circuit DLY is passed through the buffer BUF to avoid malfunctions due to noise and the like.

Figure 14A:
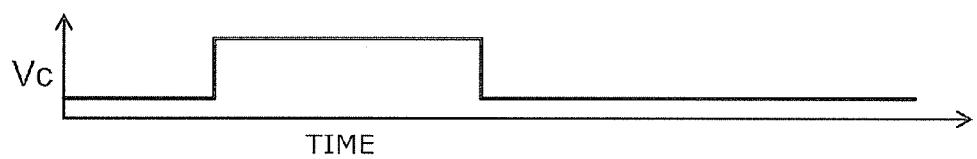
FIGS. 14A to 14C are timing charts of major signals in the edge detection circuit.
Figure 14B:
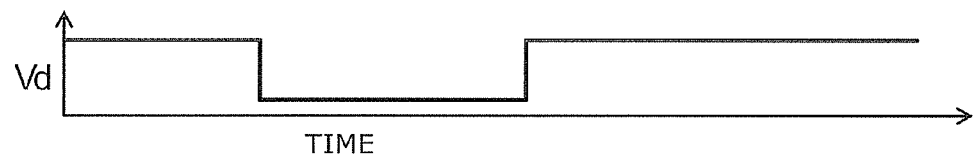
Figure 14C:
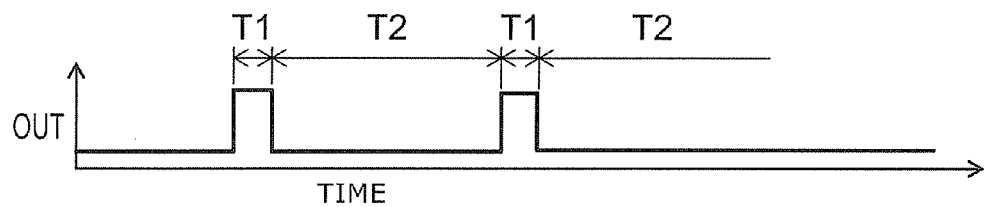

FIGS. 14A to 14C show timing charts of major signals in the edge detection circuit.

In FIGS. 14A to 14C, timing charts of major signals in the edge detection circuit 61 are shown, including the external terminal switching control signal Vc at the control terminal Ctl (FIG. 14A), the delayed signal Vd (FIG. 14B), and the output OUT (FIG. 14C).

As shown in FIG. 14C, at the rising and falling edge where the external terminal switching control signal Vc changes, a constant-width pulse is generated in the output OUT.

Figure 15:
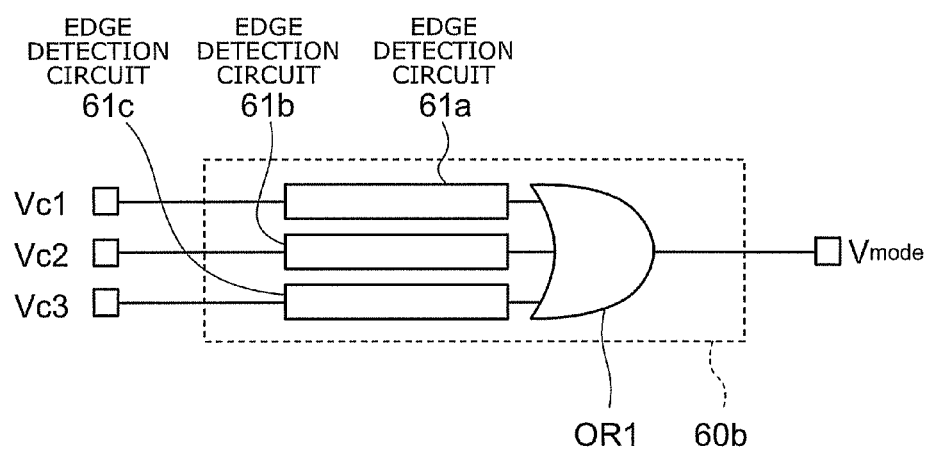
FIG. 15 is a circuit diagram illustrating the configuration of the power controller.
Figure 16:
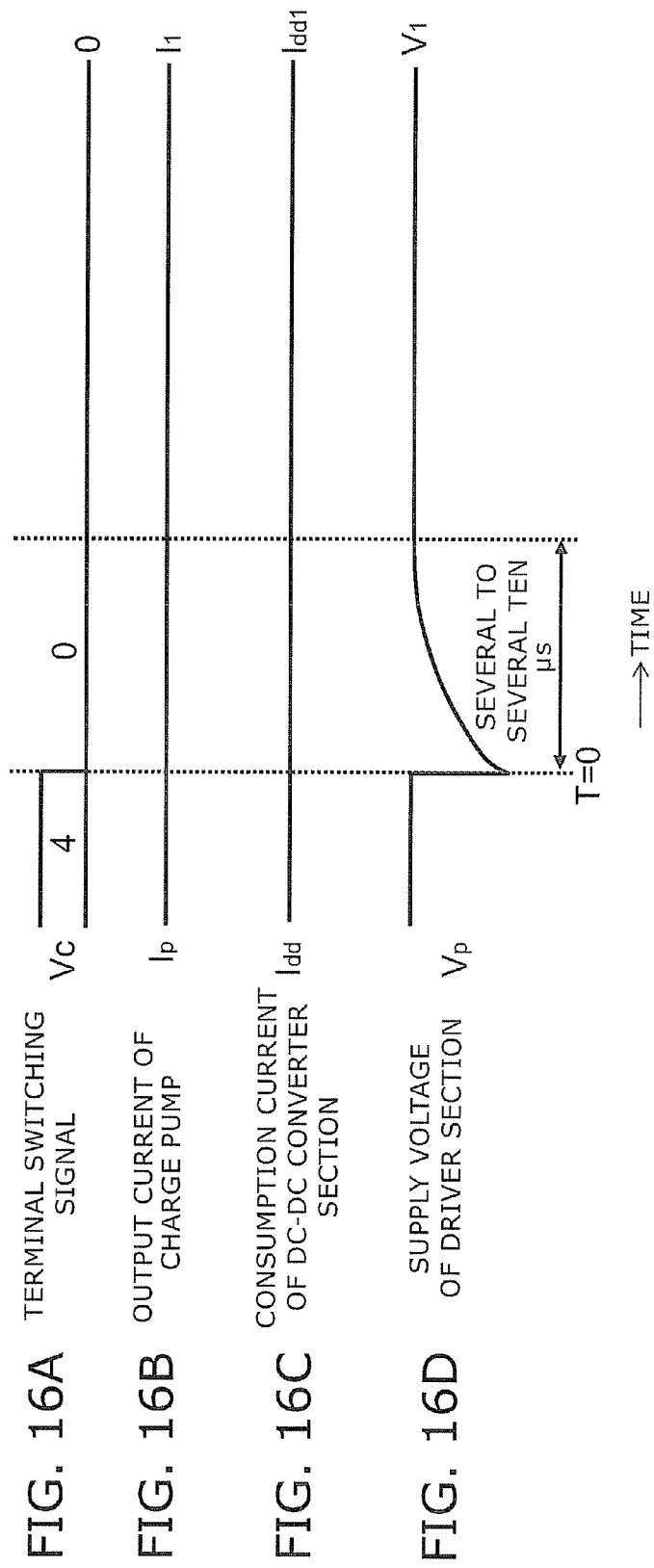
FIGS. 16A to 16D are timing charts of major signals in the switching circuit of the comparative example.

FIG. 15 is a circuit diagram illustrating the configuration of the power controller.

As shown in FIG. 15, the power controller 60b is illustratively implemented by three edge detection circuits 61a-61c and a logical OR circuit OR1. The edge detection circuits 61a-61c correspond to respective bits Vc1-Vc3 of the external terminal switching control signal Vc. The logical OR of the outputs of the edge detection circuits 61a-61c serves as the output of the power controller 60b. That is, if at least one of the bits Vc1-Vc3 of the external terminal switching control signal Vc changes, a pulse having the width of the first time period T1 is generated in the power control signal $V_{mode}$.

In the configuration illustrated in FIG. 13, a pulse having the width of the first time period T1 is generated by the edge detection circuits 61a-61c. However, the edge detection circuits 61a-61c may be implemented to generate a pulse shorter than the first time period T1, and the receiving side of the power control signal $V_{mode}$, or the DC-to-DC converter 40b, may operate for a duration of the first time period T1. The first time period T1 can illustratively be generated by a timer or a mono-stable multi-vibrator.

The power controller 60b shown in FIG. 15 is connected to the control terminal Ctl to detect switching of the external terminal switching control signal Vc. However, the power controller 60b may be connected between the decoder section 30b and the driver 20b to detect switching. Nonetheless, the best mode is achieved by connection to the control terminal Ctl, which requires detection of a smaller number of signals.

A switching circuit of a comparative example, which is different from the switching circuit 81b shown in FIG. 8 in lacking the power controller 60, is now described with reference to timing charts.

FIGS. 16A to 16D show timing charts of major signals in the switching circuit of the comparative example.

In FIGS. 16A to 16D, timing charts of major signals in the switching circuit of the comparative example are shown, where FIG. 16A shows the external terminal switching control signal Vc, FIG. 16B shows the output current $I_p$ of the charge pump 42b, FIG. 16C shows the consumption current $I_{dd}$ of the DC-to-DC converter 40b, and FIG. 16D shows the supply voltage $V_p$ of the driver 20b.

As shown in FIG. 16A, at time T<0, the external terminal switching control signal is in the state of Vc=4="100". That is, at time T<0, the switching section 10b is in the state in which the first terminal P10 is connected to the second terminal P05.

As shown in FIG. 16B, the output current $I_p$ of the charge pump 42b is constant at the current in the first state, $I_p=I_1$. Furthermore, as shown in FIG. 16D, the supply voltage $V_p$ of the driver 20b is also constant at $V_p=V_1$. As shown in FIG. 16C, the consumption current $I_{dd}$ of the DC-to-DC converter 40b is constant at the consumption current in the first state, $I_{an}$.

Thus, at time T<0, a stable state is realized in which the first terminal P10 is connected to the second terminal P05 in response to the inputted external terminal switching control signal Vc=4.

In this state, consider the case where at time T=0, the connection of the first terminal P10 is switched from the second terminal P05 to, for instance, the second terminal P01. As shown in FIG. 16A, this is the case where the inputted external terminal switching control signal Vc is changed at T=0 from Vc=4 to Vc=0.

The decoder section 30b decodes the external terminal switching control signal Vc and outputs a 6-bits switching control signal "000001" to the driver 20b. The driver 20b receives as input the switching control signal "000001", generates a switching driving signal, and outputs it to the switching section 10b.

At this time, as shown in FIG. 16B, the output current $I_p$ of the charge pump 42b is left unchanged, constant at $I_p=I_1$ before and after T=0. Furthermore, the consumption current $I_{dd}$ of the DC-to-DC converter is also left unchanged before and after T=0 because no change occurs in the current-consuming circuit before and after T=0.

On the other hand, in the switching section 10b, the connection of the first terminal P10 is switched from the second terminal P05 to the second terminal P01. Hence, the switching element so far turned on is turned off, and the switching element so far turned off is turned on. For instance, for a switching element implemented by FETs as shown in FIG. 9, when an FET is turned on, electric charge is charged in the gate capacitance of the FET. This temporarily increases release of the charge accumulated in the capacitor of the charge pump 42b and temporarily drops the supply voltage $V_p$ of the driver 20b, which subsequently returns to the voltage before switching of the switching section 10b in approximately several to several ten μs until charge is accumulated again in the charge pump 42b.

As described above, in operation, the supply voltage $V_p$ of the driver 20b once drops at the time of switching of the second terminal P01-P06 of the switching section 10b, and returns to the steady state voltage while the capacitor of the charge pump 42b is recharged. After the voltage drop of the voltage $V_p$ at the time of switching of the second terminal P01-P06 of the switching section 10b, the time to return to the steady state voltage by charging the capacitor of the charge pump 42b is shorter when the output current of the charge pump 42b is higher, and longer when it is lower. Furthermore, the total consumption current $I_{dd}$ of the switching circuit is characterized in that it is larger when the output current of the charge pump 42b is higher, and smaller when it is lower.

On the other hand, for instance, mobile units and the like need to meet the requirement that switching of the second terminal P01-P06 of the switching circuit be completed within several to several ten μs to achieve desired RF characteristics. Hence, the output current of the charge pump 42b needs to be sufficiently increased to satisfy the requirement.

However, in the comparative example lacking the power controller 60, the charge pump 42b is driven at the same output current $I_p=I_1$ still in the steady state after completion of switching. Hence, there is a limit to the reduction of the consumption current of the switching circuit while satisfying the prescribed switching time. The output current of the charge pump 42b is consumed through the clamp circuit 51 without being used.

Next, a description is given of the operation of the switching circuit 81b shown in FIG. 8, that is, in the case with the power controller 60.

FIGS. 17A to 17E show timing charts of major signals in the switching circuit shown in FIG. 8.

Figure 17:
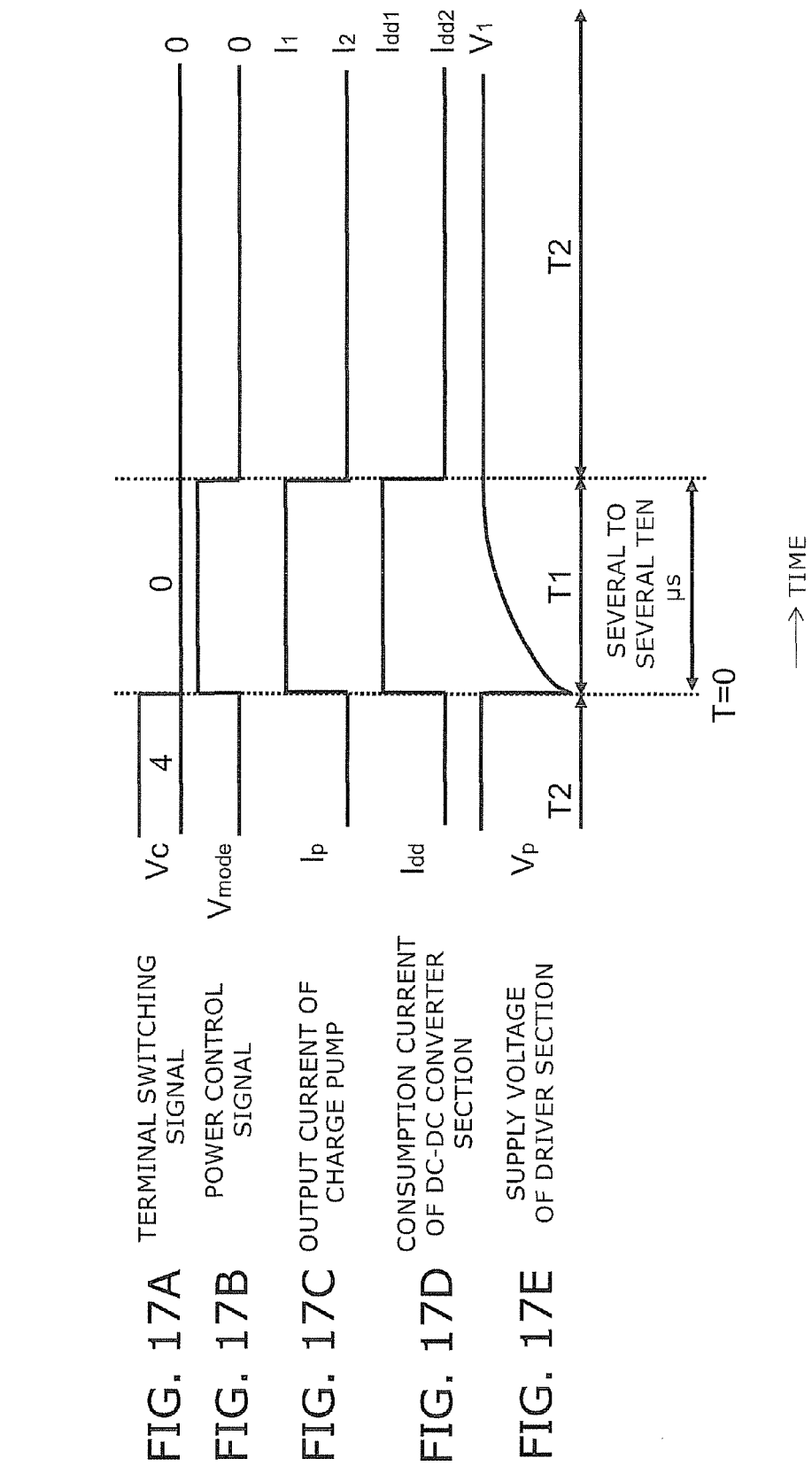
FIGS. 17A to 17E are timing charts of major signals in the switching circuit shown in FIG. 8.

In FIGS. 17A to 17E, timing charts of major signals in the switching circuit 81b are shown, where FIG. 17A shows the external terminal switching control signal Vc, FIG. 17B shows the power control signal $V_{mode}$, FIG. 17C shows the output current $I_p$ of the charge pump 42b, FIG. 17D shows the consumption current $I_{dd}$ of the DC-to-DC converter 40b, and FIG. 17E shows the supply voltage $V_p$ of the driver 20b.

As shown in FIG. 17A, at time T<0, the external terminal switching control signal is in the state of Vc=4="100". That is, at time T<0, the switching section 10b is in the state in which the first terminal P10 is connected to the second terminal P05.

Furthermore, as shown in FIG. 17B, at time T<0, because the external terminal switching control signal Vc is left unchanged, the power control signal $V_{mode}$ is "0".

As shown in FIGS. 17C and 17D, at time T<0, the output current of the charge pump 42b is $I_p=I_2$, and the supply voltage $V_p$ of the driver 20b supplied from the charge pump 42b is also constant at $V_p=V_1$. Hence, the consumption current $I_{dd}$ of the DC-to-DC converter 40b is constant at $I_{dd}=I_{dd2}$.

Thus, at time T<0, a stable state is realized in which the first terminal P10 is connected to the second terminal P05 in response to the inputted external terminal switching control signal Vc=4. Furthermore, the charge pump 42b outputs a steady state current $I_2$, and the DC-to-DC converter 40b is in the second state. That is, the switching circuit 81b is in the state of low current consumption.

In this state, consider the case where at time T=0, the connection of the first terminal P10 is switched from the second terminal P05 to, for instance, the second terminal P01. As shown in FIG. 17A, this is the case where the inputted external terminal switching control signal Vc is changed at T=0 from Vc=4="100" to Vc=0="000".

The decoder section 30b decodes the external terminal switching control signal Vc and outputs a switching control signal to the driver 20b. The driver 20b receives as input the switching control signal, generates a switching driving signal, and outputs it to the switching section 10b.

At this time, as shown in FIGS. 17B to 17D, the power control signal $V_{mode}$ changes from "0" to "1", and the output current of the charge pump 42b changes from $I_p=I_2$ to $I_1$. The consumption current $I_{dd}$ of the DC-to-DC converter 40b also changes from $I_{dd}=I_{dd2}$ to $I_{dd1}$. In sum, the resulting state is the first state of fast response to a load transient, or the state of high current consumption.

As shown in FIG. 17E, the supply voltage $V_p$ of the driver 20b drops because the switching element of the switching section 10b is switched at time T=0.

At this time, as shown in FIGS. 17B to 17D, the power control signal $V_{mode}$ is "1", and hence the output current $I_p$ of the charge pump 42b is switched to the current $I_1$ in the first state. Electric charge is charged in the capacitor of the charge pump 42b so as to recover the dropped voltage $V_p$ to the steady state voltage within a prescribed time. Thus, the consumption current $I_{dd}$ of the DC-to-DC converter is increased to $I_{dd1}$ while the power control signal $V_{mode}$ is "1".

That is, while the power control signal $V_{mode}$ is "1", the DC-to-DC converter 40b is in the first state of fast response to a load transient. The output current $I_p$ of the charge pump 42b in this first state is $I_1$, which is equal to that of the switching circuit of the comparative example shown in FIG. 16.

Hence, as shown in FIG. 17E, as in the switching circuit of the comparative example, the supply voltage $V_p$ of the driver 20b returns to the steady state voltage in several to several ten μs.

This time period for the supply voltage $V_p$ of the driver 20b to return to the steady state serves as the first time period T1. The power controller 60 performs control so that the power control signal $V_{mode}$ returns from "1" to "0" after the lapse of the first time period T1 (FIG. 17B).

When the power control signal $V_{mode}$ becomes "0", the output current $I_p$ of the charge pump 42b returns to the current $I_2$. The consumption current $I_{dd}$ of the DC-to-DC converter 40b also returns to the low consumption current $I_{dd2}$.

Subsequently, the time T>T1 is again in the second time period T2 with the state of low current consumption. At this time, the capacitor of the charge pump 42b, which released charge to switch the switching element, has already been recharged, and hence has no problem with its operation even in the second state in which the output current $I_p$ of the charge pump 42b is the steady state current $I_2$.

Thus, in the switching circuit 81b, the output current $I_1$ of the charge pump 42b in the first state can be set equal to the output current of the charge pump 42b of the comparative example lacking the power controller 60.

Hence, in contrast to the switching circuit of the comparative example lacking the power controller 60, the switching circuit 81b can achieve a lower current consumption in the steady state other than during the terminal switching operation.

For instance, in the case where the switching circuit 81b is used in a UMTS/GSM dual mode cell phone unit, in the UMTS mode, switching of the second terminal P01-P06 connected to the first terminal P10 is performed only at the time of handover during both standby and call in progress. In the GSM mode, during call in progress, terminal switching is performed constantly because it occurs between transmission and reception, and during standby, terminal switching is performed only at the time of handover. That is, the second state of low current consumption is the steady state of the switching circuit 81b.

Thus, the switching circuit 81b is set in the first state of high current consumption only when the second terminal P01-P06 connected to the first terminal P10 is switched in response to change in the inputted external terminal switching control signal. Furthermore, it returns to the second state of low current consumption during the second time period in which the steady state recovers after the terminal switching. Thus, this embodiment can achieve low current consumption.

Furthermore, in the second state, or the steady state, the supply voltage $V_p$ of the driver 20 is equal to the supply voltage $V_p=V_1$ of the switching circuit of the comparative example. Thus, low distortion characteristics are also maintained.

Hence, in the case where the switching circuit 81b is used in a cell phone unit, for instance, the second state of low current consumption is the steady state, which leads to reduction of total current consumption in the cell phone unit.

In the switching circuit 81b, the power controller 60 included in the switching circuit 81b detects an external terminal switching control signal to control switching of the operation mode from the second state to the first state. Thus, the switching circuit 81b does not need to include a terminal for externally controlling the DC-to-DC converter 40b. This also eliminates the need of control, for instance, for synchronizing the timing between the external terminal switching control signal of the switching circuit 81b and the power control signal for controlling the DC-to-DC converter 40b.

In the switching circuit 81b, the supply voltage of the driver supplied from the DC-to-DC converter 40b is illustratively higher than the externally supplied voltage Vdd. That is, the DC-to-DC converter 40b is illustratively a step-up power supply. However, the invention is not limited thereto, but can achieve a similar effect also for conversion to any of step-up, step-down, and negative voltage, or combinations thereof.

Figure 18:
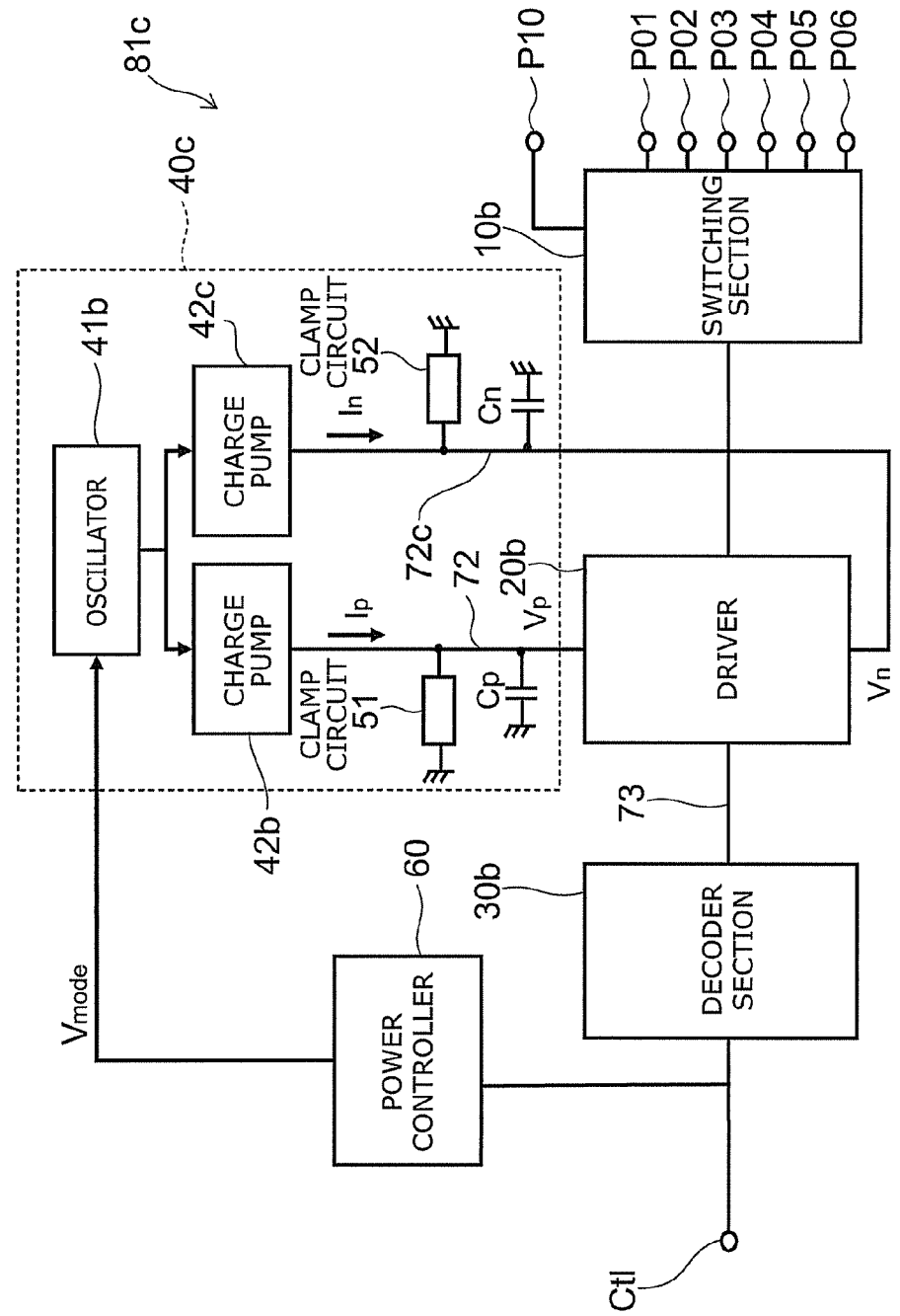
FIG. 18 is a block diagram illustrating another configuration of the switching circuit according to the embodiment of the invention.

FIG. 18 is a block diagram illustrating another configuration of the switching circuit according to the embodiment of the invention.

As shown in FIG. 18, the switching circuit 81c is different from the switching circuit 81b shown in FIG. 8 in that the DC-to-DC converter 40c further includes a charge pump 42c for generating a negative voltage $V_n$. Here, a clamp circuit 52 and a capacitor Cn are connected to an output 72c of the charge pump 42c.

Figure 19:
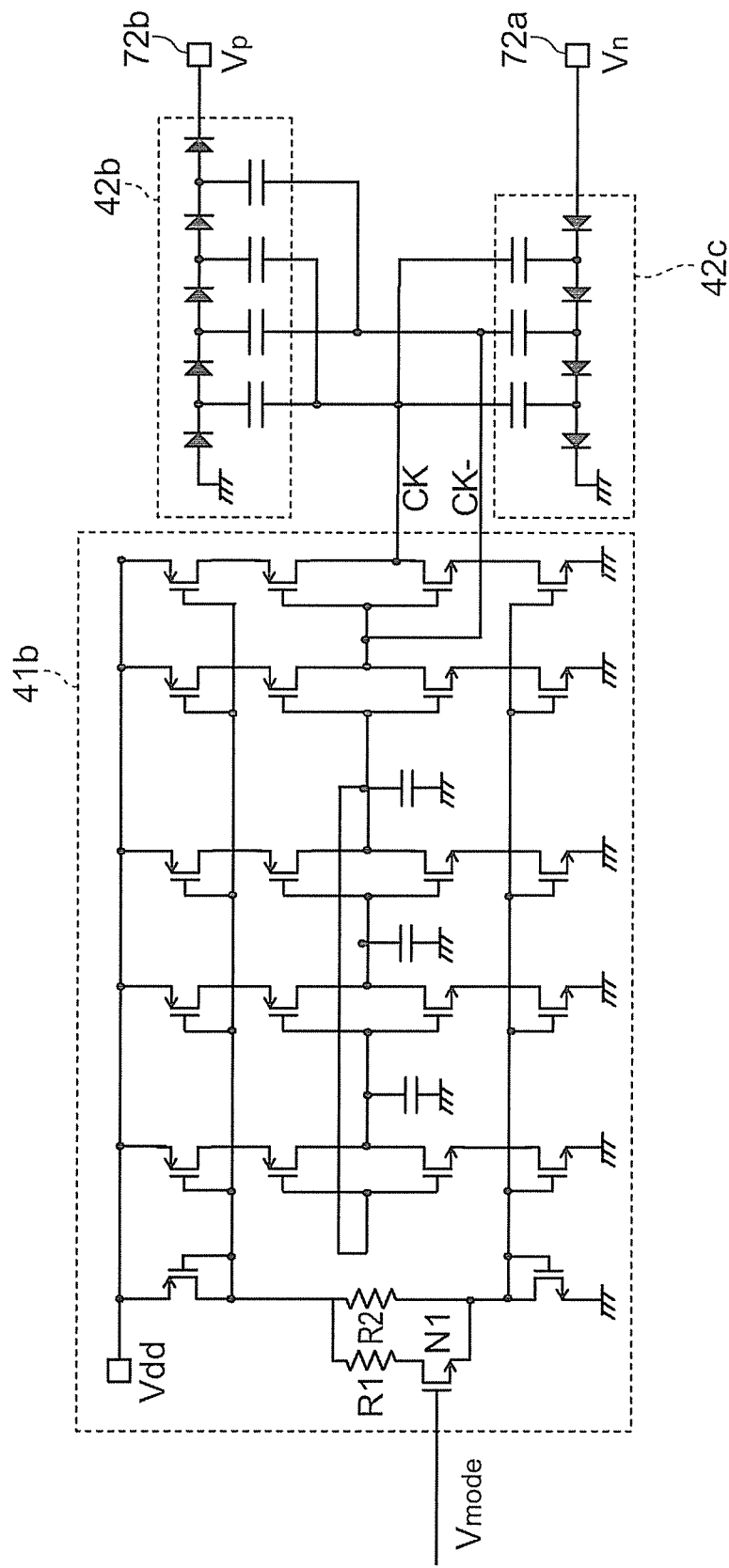
FIG. 19 is a circuit diagram illustrating the configuration of the oscillator and the charge pumps.

FIG. 19 is a circuit diagram illustrating the configuration of the oscillator and the charge pumps.

As shown in FIG. 19, the oscillator 41b and the charge pump 42b are the same as the oscillator 41b and the charge pump 42b shown in FIG. 12. The charge pump 42c outputs a negative voltage $V_n$ to the low-potential power supply terminal 72a. The charge pump 42c is the same as the charge pump 42b except that the diodes are reversed in direction and have a smaller number of stages.

The ring oscillator 41b is the same as that shown in FIG. 12. In the second state in which the power control signal $V_{mode}$ is "0", the output currents of the charge pumps 42b and 42c are each in the state of low current consumption. In the first state in which the power control signal $V_{mode}$ is "1", the output currents are each higher than in the second state.

Figure 20:
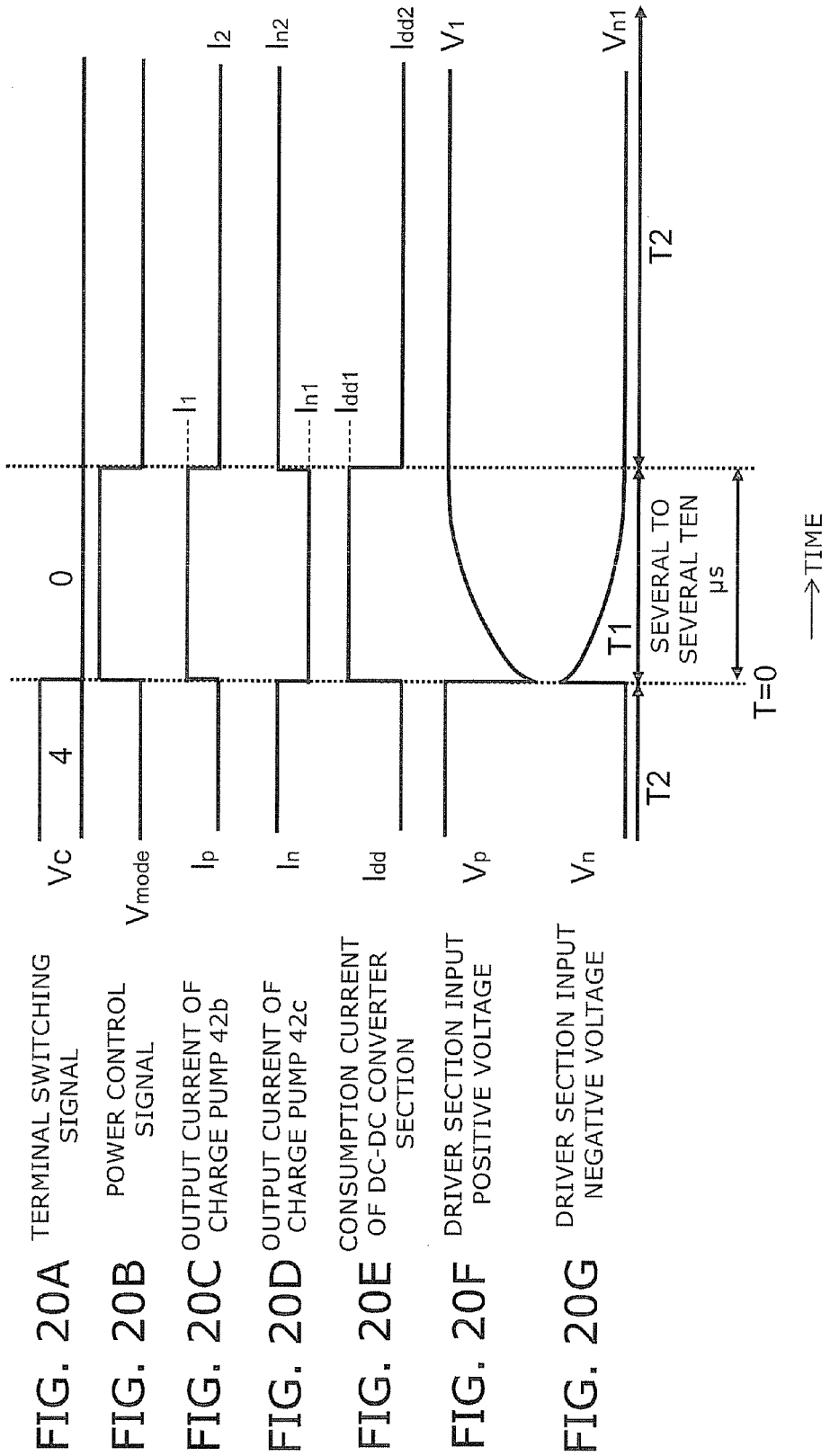
FIGS. 20A to 20G are timing charts of major signals in the switching circuit shown in FIG. 18.

FIG. 20 shows timing charts of major signals in the switching circuit 81c shown in FIG. 18.

In FIGS. 20A to 20G, timing charts of major signals in the switching circuit 81c are shown, where FIG. 20A shows the external terminal switching control signal Vc, FIG. 20B shows the power control signal $V_{mode}$, FIG. 20C shows the output current $I_p$ of the charge pump 42b, FIG. 20D shows the output current $I_n$ of the charge pump 42c, FIG. 20E shows the consumption current $I_{dd}$ of the DC-to-DC converter 40c, FIG. 20F shows the driver 20b input positive voltage (high-potential power supply voltage) $V_p$, and FIG. 20G shows the driver 20b input negative voltage (low-potential power supply voltage) $V_n$.

As shown in FIG. 20A, at time T<0, the external terminal switching control signal is in the state of Vc=4="100". That is, at time T<0, the switching section 10b is in the state in which the first terminal P10 is connected to the second terminal P05.

Furthermore, as shown in FIG. 20B, at time T<0, because the external terminal switching control signal Vc is left unchanged, the power control signal $V_{mode}$ is "0".

As shown in FIGS. 20C and 20D, at time T<0, the output currents of the charge pumps 42b and 42c are constant at $I_p=I_2$ and $I_n=I_{n2}$, respectively. The supply voltages $V_p$, $V_n$ of the driver 20b supplied from the charge pumps 42b, 42c are also constant at $V_p=V_1$, $V_n=V_{n1}$. Hence, the consumption current $I_{dd}$ of the DC-to-DC converter 40c is also constant at $I_{dd}=I_{dd2}$ in the state of low current consumption.

Thus, at time T<0, a stable state is realized in which the first terminal P10 is connected to the second terminal P05 in response to the inputted external terminal switching control signal Vc=4. Furthermore, the charge pumps 42b and 42c output steady state currents $I_2$ and $I_{n2}$, respectively, and the DC-to-DC converter 40c is in the second state. That is, the switching circuit 81c is in the state of low current consumption.

In this state, consider the case where at time T=0, the connection of the first terminal P10 is switched from the second terminal P05 to, for instance, the second terminal P01. As shown in FIG. 20A, this is the case where the inputted external terminal switching control signal Vc is changed at T=0 from Vc=4="100" to Vc=0="000".

The decoder section 30 decodes the external terminal switching control signal Vc and outputs a switching control signal to the driver 20. The driver 20 receives as input the switching control signal, generates a switching driving signal, and outputs it to the switching section 10b.

At this time, as shown in FIGS. 20B to 20E, the power control signal $V_{mode}$ changes from "0" to "1", and the output currents of the charge pumps 42b and 42c change from $I_p=I_2$ to $I_1$ and from $I_n=I_{n2}$ to $I_{n1}$, respectively. The consumption current $I_{dd}$ of the DC-to-DC converter also changes from $I_{dd}=I_{dd2}$ to $I_{dd1}$. In sum, the resulting state is the first state of fast response to a load transient, or the state of high current consumption.

As shown in FIG. 20F, the high-potential power supply voltage $V_p$ of the driver 20 drops because the switching element of the switching section 10b is switched at time T=0. Likewise, the low-potential power supply voltage $V_n$ increases at time T=0 (FIG. 20G).

At this time, as shown in FIGS. 20B to 20E, the power control signal $V_{mode}$ is "1", and hence the output currents $I_p$ and $I_n$ of the charge pumps 42b and 42c are switched to currents and $I_{n1}$, respectively. Electric charge is charged in the capacitor of the charge pump 42b so as to recover the dropped voltage $V_p$ to the steady state voltage within a prescribed time. Likewise, electric charge is charged in the capacitor of the charge pump 42c so as to recover the increased voltage $V_n$ to the steady state voltage within a prescribed time. Thus, the consumption current $I_{dd}$ of the DC-to-DC converter 40c is increased to $I_{dd1}$ while the power control signal $V_{mode}$ is "1".

That is, while the power control signal $V_{mode}$ is "1", the DC-to-DC converter 40c is in the first state of fast response to a load transient. The output currents of the charge pumps 42b and 42c in this first state are $I_p=I_1$ and $I_n=I_{n1}$.

As shown in FIGS. 20F and 20G, as in the switching circuit of the comparative example, the supply voltages $V_p$ and $V_n$ of the driver 20b return to the steady state voltages in several to several ten μs.

This time period for the supply voltages $V_p$ and $V_n$ of the driver 20b to return to the steady state serves as the first time period T1. The power controller 60 performs control so that the power control signal $V_{mode}$ returns from "1" to "0" after the lapse of the first time period T1 (FIG. 20B).

When the power control signal $V_{mode}$ becomes "0", the output currents $I_p$ and $I_n$ of the charge pumps 42b and 42c return to the currents $I_2$ and $I_{n2}$. The consumption current $I_{dd}$ of the DC-to-DC converter 40c also returns to the low consumption current $I_{dd2}$.

Subsequently, the time T>T1 is again in the second time period T2 with the state of low current consumption. At this time, the capacitors of the charge pumps 42b and 42c, which released charge to switch the switching element, have already been recharged, and hence have no problem with their operation even in the second state in which the output currents of the charge pumps 42b and 42c are $I_p=I_2$ and $I_n=I_{n2}$.

Thus, in the switching circuit 81c, the output currents of the charge pumps 42b and 42c in the first state can be set equal to the output currents of the charge pumps lacking the power controller 60.

Hence, in contrast to the switching circuit lacking the power controller 60, the switching circuit 81c can achieve a lower current consumption in the steady state other than during the terminal switching operation.

For instance, in the case where the switching circuit 81c is used in a UMTS/GSM dual mode cell phone unit, in the UMTS mode, switching of the second terminal connected to the first terminal is performed only at the time of handover during both standby and call in progress. In the GSM mode, during call in progress, terminal switching is performed constantly because it occurs between transmission and reception, and during standby, terminal switching is performed only at the time of handover. That is, the second state of low current consumption is the steady state of the switching circuit 81c.

Thus, the switching circuit 81c is set in the first state of high current consumption only when the second terminal P01-P06 connected to the first terminal P10 is switched in response to change in the inputted external terminal switching control signal. Furthermore, it returns to the second state of low current consumption during the second time period in which the steady state recovers after the terminal switching. Thus, this embodiment can achieve low current consumption.

Furthermore, in the second state, or the steady state, the high-potential power supply voltage $V_p$ and the low-potential power supply voltage $V_n$ of the driver 20b are equal to the supply voltages $V_p=V_1$ and $V_n=V_{n1}$ of the switching circuit lacking the power controller. Thus, low distortion characteristics are also maintained.

Hence, in the case where the switching circuit 81c is used in a cell phone unit, for instance, the second state of low current consumption is the steady state, which leads to reduction of total current consumption in the cell phone unit.

In the switching circuit 81c, the power controller 60 included in the switching circuit 81c detects an external terminal switching control signal to control switching of the operation mode from the second state to the first state. Thus, the switching circuit 81c does not need to include a terminal for externally controlling the DC-to-DC converter 40c. This also eliminates the need of control, for instance, for synchronizing the timing between the external terminal switching control signal of the switching circuit 81c and the power control signal for controlling the DC-to-DC converter 40c.

In the switching circuits 81b and 81c, the output current of the oscillator 41b in the first state is set higher than that in the second state. Thus, the output currents of the charge pumps 42b and 42c in the first state are made higher than those in the second state. That is, the DC-to-DC converter 40b and 40c in the first state have faster response to a load transient than those in the second state.

However, as in the oscillator 41a shown in FIG. 4, also by setting the oscillation frequency $f_1$ of the oscillator in the first state to be higher than that in the second state, the output current of the charge pump 42 in the first state can be made higher than that in the second state, that is, the response of the DC-to-DC converter 40 to a load transient can be made faster in the first state than in the second state.

Furthermore, by setting both the oscillation frequency and output current of the oscillator in the first state to be higher than those in the second state, the output current of the charge pump in the first state can be made higher than that in the second state, that is, the response of the DC-to-DC converter to a load transient can be made faster in the first state than in the second state.

In the switching circuit 81c, the operation is described with reference to an illustrative configuration of SP6T in which one first terminal P10 is connected to one of six second terminals P01-P06. However, the invention is not limited thereto, but it is also possible to similarly implement an SPnT switching circuit including n (n being a natural number greater than one) second terminals P01-P0N.

Furthermore, it is also possible to similarly implement an mPnT (m-pole n-throw) switching circuit including an arbitrary number, m, of first terminals.

Furthermore, in the switching circuit 81c, as described with reference to FIG. 11, insertion loss characteristics and distortion characteristics can be improved by driving the switching FETs using a positive supply voltage $V_p$ and a negative supply voltage $V_n$.

Figure 21:
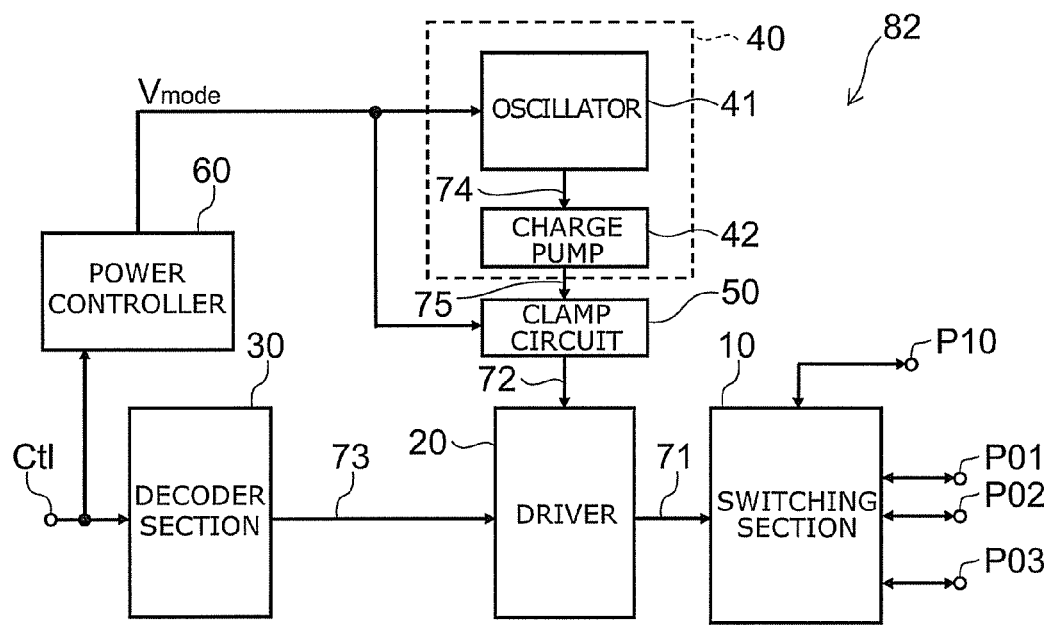
FIG. 21 is a block diagram illustrating the configuration of a switching circuit according to another embodiment of the invention.

FIG. 21 is a block diagram illustrating the configuration of a switching circuit according to another embodiment of the invention.

As shown in FIG. 21, the switching circuit 82 of this embodiment is different from the switching circuit 81 in including a clamp circuit 50, and the rest is the same as the switching circuit 81 shown in FIG. 1.

The clamp circuit 50 stabilizes the voltage outputted from the DC-to-DC converter 40 and supplies power to the driver 20. The clamp circuit 50 can illustratively be implemented by a plurality of series connected diodes. By turn-on of the diodes, the forward voltage can be clamped. Alternatively, the clamp circuit 50 can also be implemented by FETs. In the case of implementation by FETs, an ON/OFF controllable clamp circuit 50 is implemented by using the power controller 60 to controllably turn on or off the FETs.

When the power control signal $V_{mode}$ is "0", that is, when the DC-to-DC converter 40 is in the second state, the clamp circuit 50 is turned on, stabilizing the voltage outputted from the DC-to-DC converter 40 and supplying it to the driver 20.

On the other hand, when the power control signal $V_{mode}$ is "1", that is, when the DC-to-DC converter 40 is set in the first state upon switching of the second terminal, the clamp circuit 50 is turned off, and the voltage outputted from the DC-to-DC converter 40 is directly supplied to the driver 20.

FIG. 22 shows timing charts of major signals in the switching circuit shown in FIG. 21.

In FIGS. 22A to 22F, timing charts of major signals in the switching circuit 82 are shown, where FIG. 22A shows the external terminal switching control signal Vc, FIG. 22B shows the power control signal $V_{mode}$, FIG. 22C shows the operation of the clamp circuit 50, FIG. 22D shows the oscillator oscillation frequency f, FIG. 22E shows the consumption current $I_{dd}$ of the DC-to-DC converter 40, and FIG. 22F shows the supply voltage $V_P$ of the driver 20.

As shown in FIG. 22A, at time T<0, the external terminal switching control signal is in the state of Vc=2="10". That is, at time T<0, the switching section 10 is in the state in which the first terminal P10 is connected to the second terminal P03.

Furthermore, as shown in FIG. 22B, at time T<0, because the external terminal switching control signal Vc is left unchanged, the power control signal $V_{mode}$ is "0".

As shown in FIGS. 22D to 22F, at time T<0, the oscillation frequency f of the oscillator 41 is f=$f_2$, and the supply voltage $V_p$ of the driver 20 supplied from the charge pump 42 is also constant at $V_p$=$V_1$. The consumption current $I_{dd}$ of the DC-to-DC converter 40 is constant at $I_{dd}$=$I_{dd2}$.

As shown in FIG. 22C, at time T<0, the clamp circuit 50 is turned on, stabilizing the output of the DC-to-DC converter 40 and supplying power to the driver 20.

Thus, at time T<0, a stable state is realized in which the first terminal P10 is connected to the second terminal P03 in response to the inputted external terminal switching control signal Vc=2. Furthermore, the oscillator 41 is oscillated at a low frequency, the second frequency $f_2$, and the DC-to-DC converter 40 is in the second state. That is, the switching circuit 82 is in the state of low current consumption.

In this state, consider the case where at time T=0, the connection of the first terminal P10 is switched from the second terminal P03 to, for instance, the second terminal P02. As shown in FIG. 22A, this is the case where the inputted external terminal switching control signal Vc is changed at T=0 from Vc=2="10" to Vc=1="01".

The decoder section 30 decodes the external terminal switching control signal Vc and outputs a switching control signal to the driver 20. The driver 20 receives as input the switching control signal, generates a switching driving signal, and outputs it to the switching section 10.

At this time, as shown in FIGS. 22B to 22E, the power control signal $V_{mode}$ changes from "0" to "1", and the clamp circuit 50 is turned off. The oscillation frequency f of the oscillator 41 changes from f=$f_2$ to $f_1$. Furthermore, the consumption current $I_{dd}$ of the DC-to-DC converter 40 also changes to $I_{dd}$=$I_{dd1}$. In sum, the resulting state is the first state of fast response to a load transient, or the state of high current consumption.

As shown in FIG. 22F, the supply voltage $V_p$ of the driver 20 drops because the switching element of the switching section 10 is switched at time T=0.

At this time, as shown in FIGS. 22B to 22D, the power control signal $V_{mode}$ is "1", and hence the oscillation frequency f of the oscillator 41 is the high frequency $f_1$.

That is, while the power control signal $V_{mode}$ is "1", the DC-to-DC converter 40 is in the first state of fast response to a load transient.

In this first state, the capacitor of the charge pump 42, having discharged its charge, is being charged, and there is no need to stabilize the potential by the clamp circuit 50. During this first state, if the clamp circuit 50 is left turned on, an unnecessary current will flow in the clamp circuit 50. Thus, as in this embodiment, current consumption can be reduced by turning it on and off in synchronization with the state of the DC-to-DC converter 40.

Figure 7:
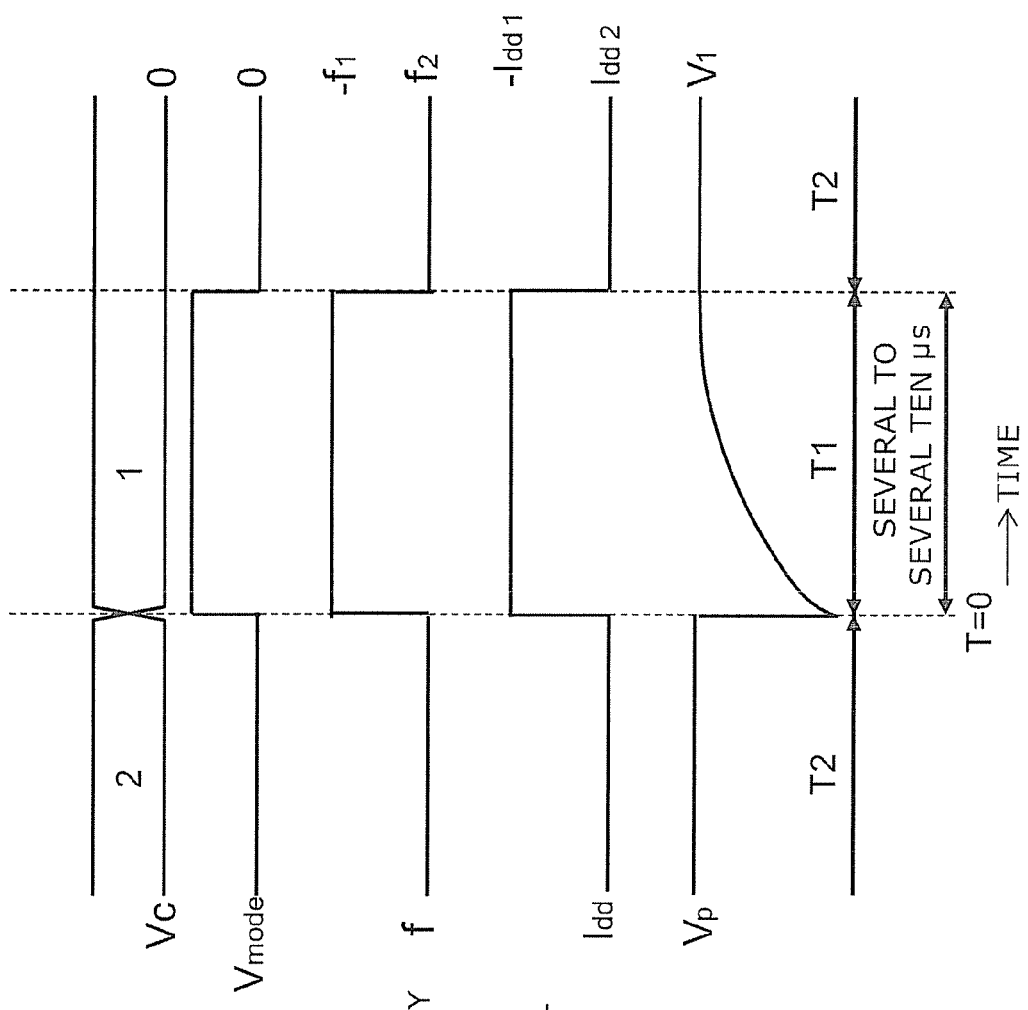
FIGS. 7A to 7E are timing charts of major signals in the switching circuit shown in FIG. 1.

After the first time period T1, as in the switching circuit 81 shown in FIG. 7, the supply voltage $V_p$ of the driver 20 returns to the steady state, and the power control signal $V_{mode}$ returns from "1" to "0".

Thus, the switching circuit 82 of this embodiment is set in the first state of high current consumption, in which the clamp circuit 50 is turned off, only when the second terminal P01-P03 connected to the first terminal P10 is switched in response to change in the inputted external terminal switching control signal. Furthermore, it returns to the second state of low current consumption, in which the clamp circuit 50 is turned on, during the second time period in which the steady state recovers after the terminal switching. Thus, this embodiment can achieve low current consumption.

In the switching circuit 82 of this embodiment, the operation is described with reference to an illustrative configuration of SP3T in which one first terminal P10 is connected to one of three second terminals P01-P03. However, the invention is not limited thereto, but it is also possible to similarly implement an SPnT switching circuit including n (n being a natural number greater than one) second terminals P01-P0N. Furthermore, it is also possible to similarly implement an mPnT (m-pole n-throw) switching circuit including an arbitrary number, m, of first terminals.

The configuration of the switching circuit 82 is illustratively based on the switching circuit 81 shown in FIG. 1, additionally including the clamp circuit 50 controlled by the power control signal $V_{mode}$. Likewise, it is also possible to provide a configuration based on the switching circuit 81b, 81c shown respectively in FIGS. 8 and 18, additionally including the clamp circuit 50 controlled by the power control signal $V_{mode}$.

The embodiments of the invention have been described with reference to examples. However, the invention is not limited to these examples. For instance, various specific configurations of the components constituting the switching circuit are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the switching circuit described above in the embodiments of the invention, and all the switching circuits thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. A switching circuit comprising:
   a switching section including at least one first terminal, a plurality of second terminals, and a switching element configured to connect the first terminal to one of the second terminals;
   a driver configured to drive the switching element in accordance with an external terminal switching control signal;
   a DC-to-DC converter including
      an oscillator configured to oscillate at a lower oscillation frequency in a second state than an oscillation frequency in a first state,
      a charge pump configured to operate in response to an output of the oscillator, and
      an another charge pump configured to operate in response to the output of the oscillator,
      the DC-to-DC converter configured to output a positive voltage and a negative voltage to the driver, and an absolute value of an output current for each of the positive voltage and the negative voltage in the first state being larger than an absolute value in the second state; and
   a power controller configured to control the DC-to-DC converter to operate with the first state during a first time period determined based on the change of the external terminal switching control signal, and to operate with the second state during a second time period other than the first time period.

2. The switching circuit according to claim 1, further comprising:
   a clamp circuit configured to stabilize an output voltage from the DC-to-DC converter; and
   a clamp control circuit configured to turn off the clamp circuit during the first time period and turn on the clamp circuit during the second time period.

3. A switching circuit comprising:
   a switching section including at least one first terminal, a plurality of second terminals, and a switching element configured to connect the first terminal to one of the second terminals;
   a driver configured to drive the switching element in accordance with an external terminal switching control signal;
   a DC-to-DC converter configured to output a positive voltage and a negative voltage to the driver, and an absolute value of an output current for each of the positive voltage and the negative voltage in a first state being larger than an absolute value of an output current for each of the positive voltage and the negative voltage in a second state; and
   a power controller configured to control the DC-to-DC converter to operate with the first state during a first time period determined based on the change of the external terminal switching control signal, and to operate with the second state during a second time period other than the first time period.

4. The switching circuit according to claim 3, wherein the DC-to-DC converter includes
   an oscillator configured to output a higher oscillation frequency in the first state than an oscillation frequency in the second state, and
   a plurality of charge pumps configured to operate in response to an output of the oscillator and outputting the positive voltage and the negative voltage.

5. The switching circuit according to claim 3, further comprising:
   a clamp circuit configured to stabilize an output voltage from the DC-to-DC converter; and
   a clamp control circuit configured to turn off the clamp circuit during the first time period and turn on the clamp circuit during the second time period.

* * * * *